US012604605B2

(12) United States Patent
Yan et al.

(10) Patent No.: US 12,604,605 B2
(45) Date of Patent: Apr. 14, 2026

(54) DISPLAY SUBSTRATE, METHOD FOR MANUFACTURING DISPLAY SUBSTRATE, METHOD FOR DRIVING DISPLAY SUBSTRATE, DISPLAY PANEL AND DISPLAY DEVICE

(71) Applicant: BOE TECHNOLOGY GROUP CO., LTD., Beijing (CN)

(72) Inventors: Huajie Yan, Beijing (CN); Zhiqiang Jiao, Beijing (CN); Lu Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 455 days.

(21) Appl. No.: 18/022,144

(22) PCT Filed: Apr. 26, 2022

(86) PCT No.: PCT/CN2022/089304
§ 371 (c)(1),
(2) Date: Feb. 18, 2023

(87) PCT Pub. No.: WO2023/206076
PCT Pub. Date: Nov. 2, 2023

(65) Prior Publication Data
US 2024/0276757 A1 Aug. 15, 2024

(51) Int. Cl.
*H10K 50/19* (2023.01)
*H10K 59/12* (2023.01)
*H10K 59/124* (2023.01)

(52) U.S. Cl.
CPC ......... *H10K 50/19* (2023.02); *H10K 59/1201* (2023.02); *H10K 59/124* (2023.02)

(58) Field of Classification Search
CPC ....... H10K 50/19; H10K 59/32; H10K 59/353
See application file for complete search history.

(56) References Cited

U.S. PATENT DOCUMENTS

| | | | |
|---|---|---|---|
| 10,411,188 B2 | 9/2019 | Wei et al. | |
| 10,811,475 B2 | 10/2020 | Zhang et al. | |
| 11,238,803 B2 | 2/2022 | Liu et al. | |

(Continued)

FOREIGN PATENT DOCUMENTS

| | | |
|---|---|---|
| CN | 106449659 A | 2/2017 |
| CN | 107604306 A | 1/2018 |
| CN | 109565916 A | 4/2019 |

(Continued)

*Primary Examiner* — Daniel P Shook
(74) *Attorney, Agent, or Firm* — HOUTTEMAN LAW LLC

(57) ABSTRACT

An embodiment of the present disclosure provides a display substrate, which includes: a base; a plurality of pixel units; each of the pixel units includes a pixel driving circuit located on the base, and each of the pixel unit further includes a plurality of light-emitting elements located on a side, away from the base, of the pixel driving circuit and connected with the pixel driving circuit, where at least two of the light-emitting elements in each of the pixel units are sequentially stacked in a direction away from the base. Embodiments of the present disclosure further provide a method for manufacturing a display substrate, a method for driving a display substrate, a display panel and a display device.

18 Claims, 16 Drawing Sheets

(56)                    References Cited

U.S. PATENT DOCUMENTS

2019/0237514 A1       8/2019   Tsukamoto et al.
2021/0327357 A1*   10/2021   Liu ...................... G09G 3/2003

FOREIGN PATENT DOCUMENTS

CN            110428778  A      11/2019
CN            111668383  A       9/2020
JP            2007057667  A       3/2007

* cited by examiner

A–A'

B–B'

DISPLAY SUBSTRATE, METHOD FOR MANUFACTURING DISPLAY SUBSTRATE, METHOD FOR DRIVING DISPLAY SUBSTRATE, DISPLAY PANEL AND DISPLAY DEVICE

TECHNICAL FIELD

The present disclosure relates to the field of display technology, and particularly relates to a display substrate, a method for manufacturing a display substrate, a method for driving a display substrate, a display panel and a display device.

BACKGROUND

In the flat panel display technologies, Organic Light-Emitting Diode (OLED) display products are considered by the industry as the third generation display technology subsequent to liquid crystal display (LCD) products, due to their advantages of lightness, thinness, active light-emitting, fast response speed, wide viewing angle, rich colors, high brightness, low power consumption, high and low temperature resistance, or the like.

According to the driving mode, the OLED display products are divided into Passive Matrix OLED (PMOLED) display products and Active Matrix OLED (AMOLED) display products. The PMOLED technology can only be used for manufacturing display products with small-size and low-resolution, however, the AMOLED technology may be used for manufacturing display products with large-size and high-resolution since the AMOLED display products are driven by integrating a thin film transistor (TFT) and a capacitor into each pixel and maintaining a voltage by the capacitor, therefore, the AMOLED technology is a focus of current research and a development direction of a future display technology.

SUMMARY

Embodiments of the present disclosure provide a display substrate, a method for manufacturing a display substrate, a method for driving a display substrate, a display panel and a display device.

In a first aspect, an embodiment of the present disclosure provides a display substrate, including:

a base;

a plurality of pixel units, each of the pixel units includes a pixel driving circuit located on the base, and each of the pixel unit further includes a plurality of light-emitting elements located on a side, away from the base, of the pixel driving circuit and connected with the pixel driving circuit, where at least two of the light-emitting elements in each of the pixel units are sequentially stacked in a direction away from the base.

In some implementations, each of the pixel units includes a first light-emitting element, a second light-emitting element, and a third light-emitting element;

the first light-emitting element, the second light-emitting element and the third light-emitting element are sequentially stacked in the direction away from the base;

the first light-emitting element includes a first electrode, a first light-emitting functional layer and a second electrode which are sequentially stacked in the direction away from the base;

the second electrode is common to an electrode of the second light-emitting element, the second light-emitting element includes a second light-emitting functional layer and a third electrode which are sequentially stacked in a direction away from the second electrode;

the third electrode is common to an electrode of the third light-emitting element, the third light-emitting element includes a third light-emitting functional layer and a fourth electrode sequentially stacked in a direction away from the third electrode.

In some implementations, the first electrode includes a first light-emitting pattern, and the third electrode includes a second light-emitting pattern; and an orthographic projection of the second light-emitting pattern on the base overlaps with an orthographic projection of the first light-emitting pattern on the base.

In some implementations, the orthographic projection of the second light-emitting pattern on the base is coincident with the orthographic projection of the first light-emitting pattern on the base.

In some implementations, the display substrate includes a display area, where the first light-emitting functional layer and/or the second light-emitting functional layer and/or the third light-emitting functional layer extends to cover the entire display area; and the second electrode and/or the fourth electrode extends to cover the entire display area.

In some implementations, the first light-emitting functional layer and/or the second light-emitting functional layer and/or the third light-emitting functional layer includes a third pattern, an orthographic projection of the third pattern on the base covers the orthographic projection of the first light-emitting pattern on the base;

and/or the second electrode and/or the fourth electrode includes a fourth pattern, an orthographic projection of the fourth pattern on the base covers the orthographic projection of the first liming-emitting pattern on the base.

In some implementations, the pixel driving circuit includes a first driving transistor and a second driving transistor, the first driving transistor is connected with the first electrode; and the second driving transistor is connected with the third electrode.

In some implementations, a first insulating layer is provided between a drain electrode of the first driving transistor and the first electrode, and the first electrode is connected to the drain electrode of the first driving transistor through a first via hole in the first insulating layer;

the first insulating layer and a pixel defining layer are provided between a drain electrode of the second driving transistor and the third electrode, and the third electrode is connected to the drain electrode of the second driving transistor through a second via hole formed in the second light-emitting functional layer, the second electrode, the first light-emitting functional layer, the pixel defining layer and the first insulating layer.

In some implementations, the pixel defining layer has an opening formed therein, the first light-emitting pattern is located in the opening;

an orthographic projection of the first via hole on the base is at least partially overlapped or not overlapped with the orthographic projection of the first light-emitting pattern on the base; and an orthographic projection of the second via hole on the base does not overlap with the orthographic projection of the first light-emitting pattern on the base.

In some implementations, the display substrate further includes a frame area surrounding the display area, where the display substrate further includes a first potential line and/or a second potential line;

the first potential line and the second potential line are located in the frame area;

the second electrode and the fourth electrode are respectively connected with the first potential line or the second potential line; or the second electrode is connected with the first potential line, and the fourth electrode is connected with the second potential line.

In some implementations, the first light-emitting element, the second light-emitting element and the third light-emitting element emit light with different colors; and in the plurality of pixel units, the colors of light emitted by first light-emitting elements are the same, the colors of light emitted by second light-emitting elements are the same, and the colors of light emitted by third light-emitting elements are the same.

In some implementations, the first light-emitting element, the second light-emitting element and the third light-emitting element emit light with different colors;

in the plurality of pixel units, the colors of light emitted by part of the first light-emitting elements are different, the colors of light emitted by part of the second light-emitting elements are different, and the colors of light emitted by part of the third light-emitting elements are different.

In some implementations, the first light-emitting element, the second light-emitting element and the third light-emitting element emit light of the same color.

In some implementations, the display substrate further includes a color filter layer on a side of the light-emitting elements away from the base;

the color filter layer includes a first color filter, a second color filter and a third color filter;

the first color filter, the second color filter and the third color filter are different in color; and the first color filter, the second color filter and the third color filter are respectively arranged corresponding to different pixel units.

In some implementations, the first electrode is made of an opaque conductive material; and the second electrode, the third electrode and the fourth electrode are made of a light-transmitting conductive material.

In a second aspect, an embodiment of the present disclosure further provides a display panel, which includes the display substrate described above.

In a third aspect, an embodiment of the present disclosure further provides a display device, which includes the display panel described above.

In a fourth aspect, an embodiment of the present disclosure further provides a method for manufacturing a display substrate, the method includes:

preparing a plurality of pixel units on a base, including:

firstly, preparing a pixel driving circuit on the base;

then preparing a light-emitting element on a side of the pixel driving circuit away from the base, where at least two light-emitting elements in each pixel unit are sequentially prepared in a direction away from the base to form a stacked structure of the at least two light-emitting elements in each pixel unit.

In some implementations, the method includes:

after preparing the pixel driving circuit, a first potential line and a second potential line on the base, sequentially preparing a first insulating layer, patterns of a first via hole and a third via hole in the first insulating layer, a pattern of a first electrode, a pixel defining layer and patterns of an opening and a fourth via hole in the pixel defining layer on the base, where a first light-emitting pattern in the first electrode is located in the opening, and a material of the first electrode is filled in the first via hole and the third via hole;

then preparing a first isolation pillar on the base subjected to the above preparing, where the first isolation pillar is formed in the fourth via hole;

sequentially preparing a first light-emitting functional layer, a second electrode and a second light-emitting functional layer on the base subjected to the above preparing, where the second electrode is overlapped with the first potential line;

soaking the base subjected to the above preparing in a peeling solution, peeling off the first isolation pillar and portions of the first light-emitting functional layer, the second electrode and the second light-emitting functional layer formed on the first isolation pillar, to form a fifth via hole penetrating through the second light-emitting functional layer, the second electrode and the first light-emitting functional layer, where the fifth via hole, the fourth via hole and the third via hole are communicated to form a second via hole;

preparing a pattern of a third electrode on the base prepared above, where the third electrode is connected with the pixel driving circuit through the second via hole; and sequentially preparing a third light-emitting functional layer and a fourth electrode on the base prepared above, where the fourth electrode is overlapped with the second potential line.

In some implementations, after peeling off the first isolation pillar and the portions of the first light-emitting functional layer, the second electrode and the second light-emitting functional layer formed on the first isolation pillar, and before preparing the pattern of the third electrode, the method further includes:

preparing a second isolation pillar, the second isolation pillar being arranged surrounding the pattern of the third electrode;

forming a film layer for forming the third electrode on the base subjected to the above preparing; and soaking the base prepared above in a peeling solution, and peeling off the second isolation pillar and a portion of the film layer, for forming the third electrode, formed on the second isolation pillar, to form the pattern of the third electrode.

In some implementations, the preparing a first isolation pillar includes:

after preparing the first insulating layer and patterns of the first via hole and the third via hole in the first insulating layer, the pattern of the first electrode, the pixel defining layer and the patterns of the opening and the fourth via hole in the pixel defining layer on the base, coating a sacrificial layer on the base and drying the sacrificial layer;

then coating and forming a photoresist layer on the base prepared above, and drying the photoresist layer;

exposing the photoresist layer by using a mask plate including the pattern of the first isolation pillar;

developing and then removing a portion of the photoresist layer in a region except a region corresponding to the pattern of the first isolation pillar, and reserving a portion of the photoresist layer in the region corresponding to the pattern of the first isolation pillar; and developing again and then removing a portion of the sacrificial layer in the region except the region corresponding to the pattern of the first isolation pillar, and reserving a portion of the sacrificial layer in the region corresponding to the pattern of the first isolation pillar.

In some implementations, a shape of a cross-section of the first isolation pillar perpendicular to the base is an inverted trapezoid;

a dimension of the first isolation pillar, at a longer upper base side of the inverted trapezoid, in a direction perpendicular to the base ranges from 1 μm to 10 μm.

In a fifth aspect, an embodiment of the present disclosure further provides a method for driving a display substrate, where light-emitting elements, sequentially stacked in a direction away from a base, in each pixel unit are driven by a pixel driving circuit to emit light simultaneously;

or, the light-emitting elements, sequentially stacked in the direction away from the base, in each pixel unit are driven by the pixel driving circuit to emit light in a time-sharing manner.

BRIEF DESCRIPTION OF DRAWINGS

The accompanying drawings are included to provide a further understanding of the embodiments of the present disclosure, and are incorporated in and constitute a part of this specification, illustrate embodiments of the present disclosure and together with the description serve to explain the principles of the present disclosure and do not limit the present disclosure. The above and other features and advantages will become more apparent to those skilled in the art by describing in detail exemplary embodiments of the present disclosure with reference to the accompanying drawings.

DETAIL DESCRIPTION OF EMBODIMENTS

Figure 1:
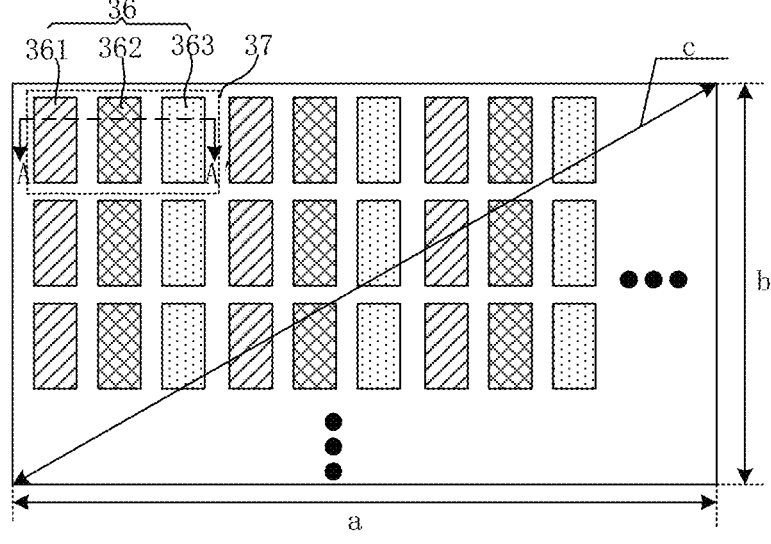
FIG. 1 is a schematic diagram of an OLED display panel in the related art in which each pixel adopting a structure of sub-pixels being arranged in sequence.

In order to make those skilled in the art better understand the technical solutions of the embodiments of the present disclosure, the following describes a display substrate, a method for manufacturing a display substrate, a method for driving a display substrate, a display panel, and a display device provided in the embodiments of the present disclosure in further detail with reference to the accompanying drawings and implementations.

The embodiments of the present disclosure will be described more fully hereinafter with reference to the accompanying drawings, but the embodiments shown may be embodied in different forms and should not be construed as limited to the embodiments set forth herein. Rather, these embodiments are provided so that the present disclosure will be thorough and complete, and will fully convey the scope of the present disclosure to those skilled in the art.

The embodiments of the present disclosure are not limited to the embodiments shown in the drawings, but include modifications of configurations formed based on a manufacturing process. Thus, regions shown in the drawings have schematic properties, and shapes of the regions shown in the drawings illustrate specific shapes of the regions, but are not intended to be limiting.

In the display field, a demand for display products with high-transmittance and high-resolution is high; a transparent display product is desired to reduce an aperture ratio of a display area to increase an area of a transparent display area so as to increase the transmittance of the display product; micro-displays (e.g., AR augmented reality, VR virtual reality) expect increased resolution of the display product to improve display effect.

In the related art, in order to realize the above display mode, in each pixel, a red (R) sub-pixel, a green (G) sub-pixel and a blue (B) sub-pixel are sequentially arranged (i.e., side by side). For example, in the related art, in a product that realizes full-color display by adopting a color filter mode combining a structure in which the sub-pixels are sequentially arranged and a white OLED (WOLED) display, the R sub-pixel, the G sub-pixel and the B sub-pixel are also flat-laid on a display panel, so that the utilization rate of the display area is low, and display with higher resolution cannot be realized.

In the related art, for OLED display products, a fine metal mask (FMM Mask) process is used for evaporation. Due to a limitation of the FMM Mask process, for medium-sized and small-sized display products, a pixel arrangement mode of sequentially arranging sub-pixels may only realize a maximum resolution of 600 ppi, and the expectation for ultrahigh resolution of the display products is difficult to be met.

Figure 2:
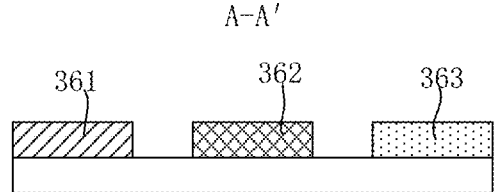
FIG. 2 is a schematic cross-sectional view of the structure in FIG. 1 taken along a cutting line AA'.

FIG. 1 is a schematic diagram of an OLED display panel, in the related art, in which each pixel adopting a structure of sub-pixels being arranged in sequence; FIG. 2 is a schematic cross-sectional view of the structure of FIG. 1 taken along a cutting line AA'; in the related art, three sub-pixels 36 (such as a red sub-pixel 361, a green sub-pixel 362 and a blue sub-pixel 363) of the OLED display panel form a pixel 37; assuming that the OLED display panel has a rectangular display area with a length a, a width b and a diagonal length c, the resolution PPi of the OLED display panel satisfies the following equation:

$$PPi = \frac{\sqrt{a^2 + b^2}}{c},$$

due to the limitation of the FMM mask process for evaporation, the resolution of the OLED display panel in the related art is about 600 ppi, and the expectation for ultrahigh resolution of the OLED display product is difficult to be met.

Figure 3:
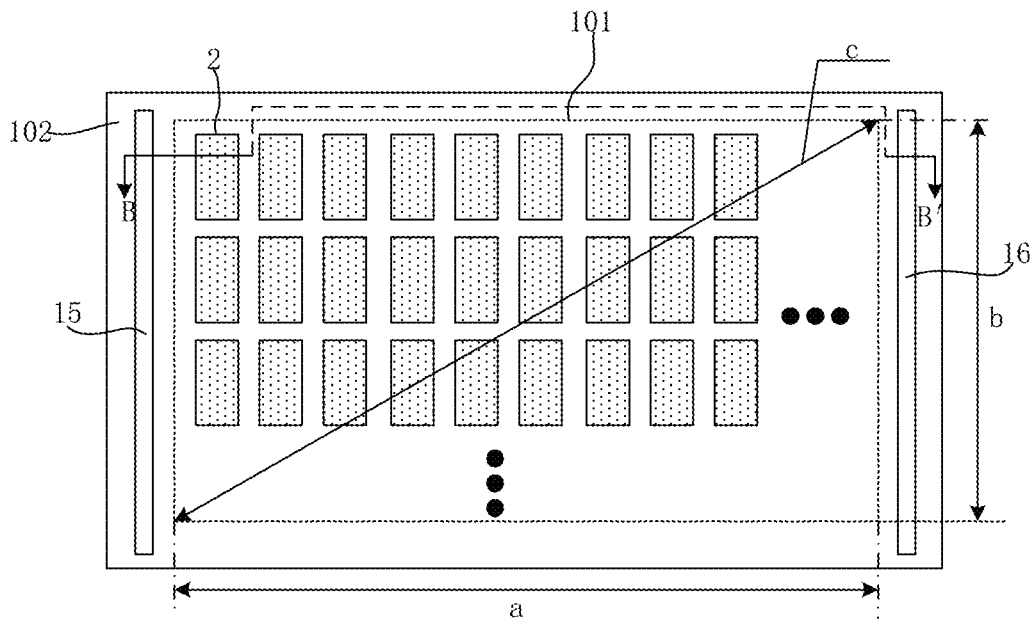
FIG. 3 is a schematic diagram of an arrangement of pixel units in a display substrate according to an embodiment of the present disclosure.
Figure 4:
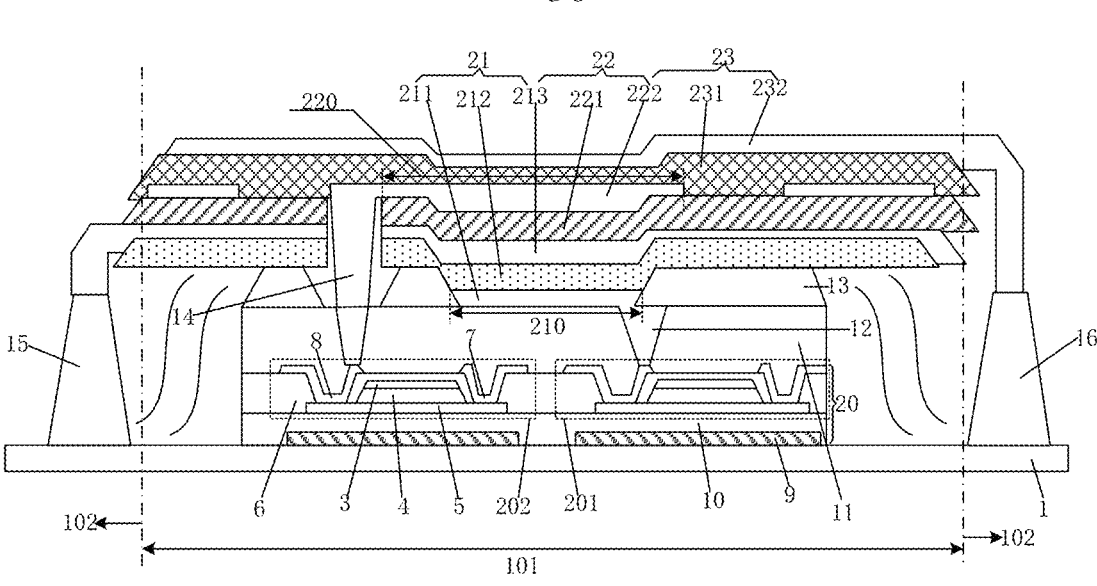
FIG. 4 is a schematic cross-sectional view of the structure in FIG. 3 taken along a cutting line BB'.

In view of the above problems in the related art, in a first aspect, an embodiment of the present disclosure provides a display substrate, and referring to FIG. 3, which shows a schematic diagram of an arrangement of pixel units in the display substrate according to the embodiment of the present disclosure, and FIG. 4 which shows a schematic cross-sectional view of the structure in FIG. 3 taken along a cutting line BB', the display substrate includes a base 1 and a plurality of pixel units 2. Each pixel unit 2 includes a pixel driving circuit 20 located on the base 1. Each pixel unit 2 further includes a plurality of light-emitting elements, which are located on a side of the pixel driving circuit 20 away from the base 1 and connected with the pixel driving circuit 20, where at least two of the light-emitting elements in each pixel unit 2 are sequentially stacked in a direction away from the base 1.

By sequentially stacking at least two of the light-emitting elements in each pixel unit 2 in the direction away from the base 1, it can be achieved that at least part of the light-emitting elements in the pixel unit 2 are stacked in a direction perpendicular to the base 1 to form a vertical arrangement structure; compared with the structure that the sub-pixels in the pixel are sequentially arranged side by side in the related art, an area of a region of the display area occupied by each pixel unit 2 can be reduced, so that on one hand, for a transparent display substrate which expects to reduce the aperture ratio of the display area to improve the area of the transparent display area, the aperture ratio of the display area can be well reduced to improve the area of the transparent display area, and further the transmittance of the display product is improved; on the other hand, for a display substrate expecting to increase the resolution to implement micro-display (such as AR augmented reality and VR virtual reality), the reduction of the area of the region of the display area occupied by each pixel unit 2 is beneficial to arranging more pixel units 2 in the vacated region of the display area, so as to improve the resolution of the display substrate for implementing micro-display, and further improve the display effect of the display substrate.

In some implementations, each pixel unit 2 includes a first light-emitting element 21, a second light-emitting element 22, and a third light-emitting element 23, which are sequentially stacked in a direction away from the base 1. The first light-emitting element 21 includes a first electrode 211, a first light-emitting functional layer 212, and a second electrode 213 sequentially stacked in the direction away from the base 1, the second electrode 213 is multiplexed as an electrode of the second light-emitting element 22. The second light-emitting element 22 includes a second light-emitting functional layer 221 and a third electrode 222 sequentially stacked in a direction away from the second electrode 213, the third electrode 222 is multiplexed as an electrode of the third light-emitting element 23. The third light-emitting element 23 includes a third light-emitting functional layer 231 and a fourth electrode 232 sequentially stacked in a direction away from the third electrode 222.

In some implementations, the light-emitting element is an organic light-emitting element, i.e., an OLED element. The light-emitting element includes two electrodes and a light-emitting functional layer sandwiched between the two electrodes, and the light-emitting functional layer can emit light under an action of an electric field formed between the two electrodes. The first light-emitting functional layer 212, the second light-emitting functional layer 221 and the third light-emitting functional layer 231 each include a Hole Transport Layer (HTL), a Hole Injection Layer (HIL), a Light-Emitting Layer (EML), an Electron Injection Layer (EIL), and an Electron Transport Layer (ETL) which are sequentially stacked.

Compared with the arrangement mode that the sub-pixels in the pixel are arranged side by side in the related art, all the light-emitting elements in the pixel unit 2 are stacked in a direction perpendicular to the base 1 to form a vertical arrangement structure, so that, on one hand, it is beneficial to improve the transmittance of the transparent display substrate, and on the other hand, it is beneficial to improve the resolution of the display substrate for micro-display, and further improve the display effect of the display substrate. Referring to FIGS. 3 and 4, compared to the arrangement of the sub-pixels in the pixel in FIG. 2 in the related art, by vertically arranging all the light-emitting elements in the pixel unit 2 in the direction perpendicular to the base 1, a region occupied by each sub-pixel in the related art becomes a region occupied by each pixel unit 2 in the embodiment of the present disclosure, so that the resolution of the display substrate can be doubled, for example, if the shape and area of the display substrate in the embodiment of the present disclosure are the same as those of the OLED display panel in the related art, then the resolution P2 of the display substrate in the embodiment of the present disclosure satisfies the following equation:

$$P2 = \frac{\sqrt{(3a)^2 + (3b)^2}}{c}.$$

Meanwhile, compared with the arrangement of the sub-pixels in the pixel in FIG. 2 in the related art, by vertically arranging all the light-emitting elements in the pixel unit 2 in the direction perpendicular to the base 1, it is indicated by experiment that, under a same driving voltage, light-emitting luminance of the pixel unit 2 in the embodiment of the present disclosure is doubled compared with the light-emitting luminance of the pixel in FIG. 2, thus, on the premise of realizing the light-emission with a preset luminance, the driving voltage for the light-emitting elements, in the vertical arrangement structure, emitting light with the preset luminance in the embodiment of the present disclosure is lower than that for the light-emitting elements, arranged side by side, emitting light with the preset luminance in the related art, so that the driving voltage of the light-emitting element can be reduced to some extent, and then the power consumption of the light-emitting element is reduced, thus the life time of the light-emitting element is prolonged, that is, the life time of the display substrate is prolonged.

In some implementations, the first electrode 211 includes a first light-emitting pattern 210, the third electrode 222 includes a second light-emitting pattern 220, and an orthographic projection of the second light-emitting pattern 220 on the base 1 overlaps an orthographic projection of the first light-emitting pattern 210 on the base 1.

The first light-emitting pattern 210 is a portion of the first electrode 211 directly contacting the first light-emitting functional layer 212, only a portion of the first light-emitting functional layer 212 directly contacting the first light-emitting pattern 210 can effectively emit light. The second light-emitting pattern 220 is a portion of the third electrode 222 directly contacting the second light-emitting functional layer 221 and the third light-emitting functional layer 231, only portions of the second light-emitting functional layer 221 and the third light-emitting functional layer 231, which are in direct contact with the second light-emitting pattern 220, can effectively emit light. The first light-emitting element 21, the second light-emitting element 22, and the third light-emitting element 23 can be independently controlled to emit light by arranging the first light-emitting pattern 210 of the first electrode 211, and the second light-emitting pattern 220 of the third electrode 222.

In some implementations, the orthographic projection of the second light-emitting pattern 220) on the base 1 coincides with the orthographic projection of the first light-emitting pattern 210 on the base 1.

In the present embodiment, the first electrode 211 is made of an opaque conductive material, the second electrode 213, the third electrode 222, and the fourth electrode 232 are made of a light-transmitting conductive material. That is, the display substrate in the present embodiment is a top-emission type OLED display substrate, and by making the orthographic projection of the second light-emitting pattern 220 on the base 1 coincide with the orthographic projection of the first light-emitting pattern 210 on the base 1, the light-emitting elements in the pixel unit 2 that are stacked perpendicular to the base 1 can have a larger effective light-emitting area, so that the light-emitting luminance and the light-emitting effect of the pixel unit 2 are improved.

Figure 5:
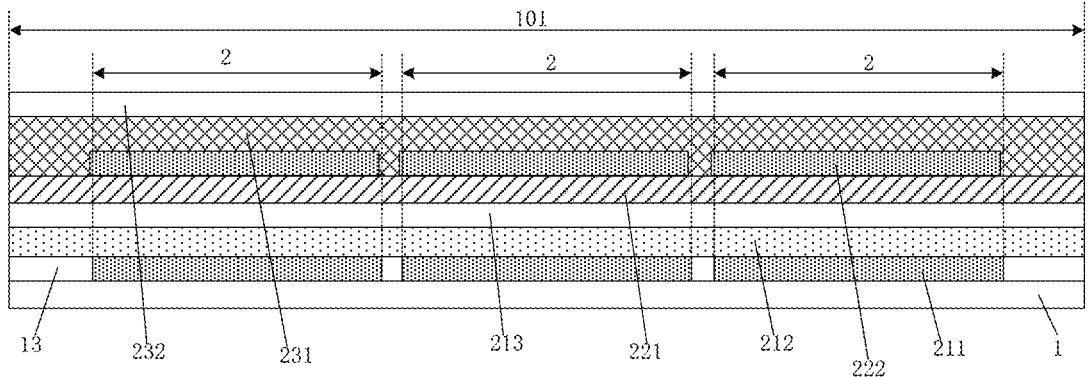
FIG. 5 is a schematic diagram of an arrangement of film layers in a display area of a display substrate according to an embodiment of the present disclosure.

FIG. 5 is a schematic diagram of an arrangement of film layers in a display area of a display substrate according to an embodiment of the present disclosure, in some implementations, the display substrate includes a display area 101, where the first light-emitting functional layer 212 and/or the second light-emitting functional layer 221 and/or the third light-emitting functional layer 231 extends to cover the entire display area 101, and the second electrode 213 and/or the fourth electrode 232 extends to cover the entire display area 101.

In some implementations, referring to FIG. 5, the first light-emitting functional layers 212, the second light-emitting functional layers 221 and the third light-emitting functional layer 231 extend to cover the entire display area 101, the second electrode 213 and the fourth electrode 232 extend to cover the entire display area 101. Therefore, the process difficulty and cost for manufacturing the display substrate can be reduced.

Figure 6:
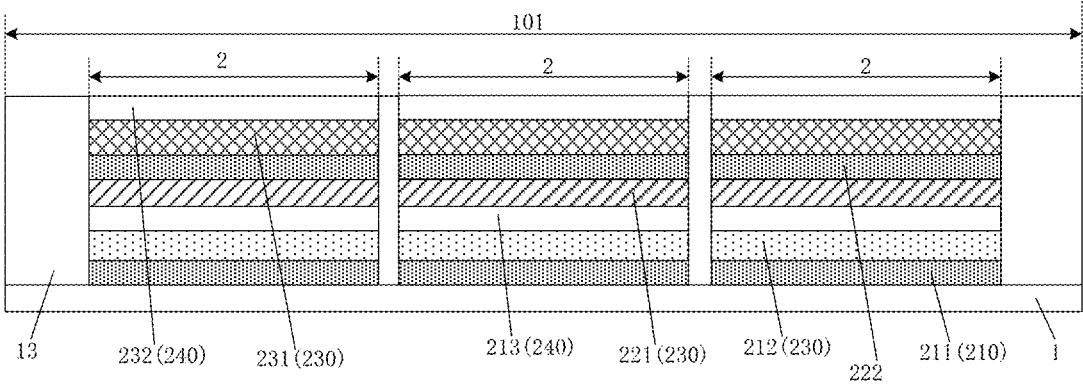
FIG. 6 is a schematic diagram of an arrangement of film layers in a display area of a display substrate according to an embodiment of the present disclosure.

FIG. 6 is a schematic diagram of an arrangement of film layers in a display area of a display substrate according to an embodiment of the present disclosure, in some implementations, as shown in FIG. 6, the first light-emitting functional layer 212 and/or the second light-emitting functional layer 221 and/or the third light-emitting functional layer 231 includes a third pattern 230, an orthographic projection of the third pattern 230 on the base 1 covers the orthographic projection of the first light-emitting pattern 210 on the base 1, and/or the second electrode 213 and/or the fourth electrode 232 includes a fourth pattern 240, an orthographic projection of the fourth pattern 240 on the base 1 covers the orthographic projection of the first light-emitting pattern 210 on the base 1.

In some implementations, referring to FIG. 6, the first light-emitting functional layers 212, the second light-emitting functional layers 221 and the third light-emitting functional layer 231 each include the third pattern 230, and the orthographic projection of the third pattern 230 on the base 1 covers the orthographic projection of the first light-emitting pattern 210 on the base 1; the second electrode 213 and the fourth electrode 232 each include the fourth pattern 240, and the orthographic projection of the fourth pattern 240 on the base 1 covers the orthographic projection of the first light-emitting pattern 210 on the base 1. With such arrangement, the process difficulty and cost for manufacturing the display substrate are relatively high.

In some implementations, referring to FIG. 4, the pixel driving circuit 20 includes a first driving transistor 201 and a second driving transistor 202, the first driving transistor 201 is connected to the first electrode 211, and the second driving transistor 202 is connected to the third electrode 222.

In some implementations, the first driving transistor 201 and the second driving transistor 202 each include a gate electrode 3, a gate insulating layer 4, an active layer 5, an intermediate dielectric layer 6, a source electrode 7, and a drain electrode 8. The gate insulating layer 4 is positioned between the gate electrode 3 and the active layer 5, the intermediate dielectric layer 6 is positioned between the active layer 5, and the source electrode 7 and the drain electrode 8, and the source electrode 7 and the drain electrode 8 are connected to the active layer 5 through via holes in the intermediate dielectric layer 6.

In some implementations, the first driving transistor 201 and the second driving transistor 202 may be thin film transistors or field effect transistors or other switching devices with similar characteristics, and the thin film transistors may include oxide semiconductor thin film transistors, amorphous silicon thin film transistors or polysilicon thin film transistors, or the like. In some implementations, the first driving transistor 201 and the second driving transistor 202 may be N-type transistors or P-type transistors.

In some implementations, the display substrate further includes a light blocking layer 9 and a buffer layer 10, the light blocking layer 9 is located on a side of the pixel driving circuit 20 close to the base 1, and an orthographic projection of the light blocking layer 9 on the base 1 covers an orthographic projection of the active layer 5 on the base 1, so as to prevent transistors in the pixel driving circuit 20 from being irradiated by light to cause the leakage current to be increased. The buffer layer 10 is located between the light blocking layer 9 and the pixel driving circuit 20, so that the pixel driving circuit 20 can be better formed on the base 1.

In some implementations, referring to FIG. 4, a first insulating layer 11 is disposed between the drain electrode 8 of the first driving transistor 201 and the first electrode 211, and the first electrode 211 is connected to the drain electrode 8 of the first driving transistor 201 through a first via hole 12 in the first insulating layer 11; the first insulating layer 11 and a pixel defining layer 13 are disposed between the drain electrode 8 of the second driving transistor 202 and the third electrode 222, and the third electrode 222 is connected to the drain electrode 8 of the second driving transistor 202 through a second via hole 14 in the second light-emitting functional layer 221, the second electrode 213, the first light-emitting functional layer 212, the pixel defining layer 13 and the first insulating layer 11.

In some implementations, the first insulating layer 11 includes a passivation layer and a planarization layer. The planarization layer is located on a side of the passivation layer away from the base 1, and the planarization layer can make a surface of the display substrate for forming the light-emitting element flush.

Figure 7:
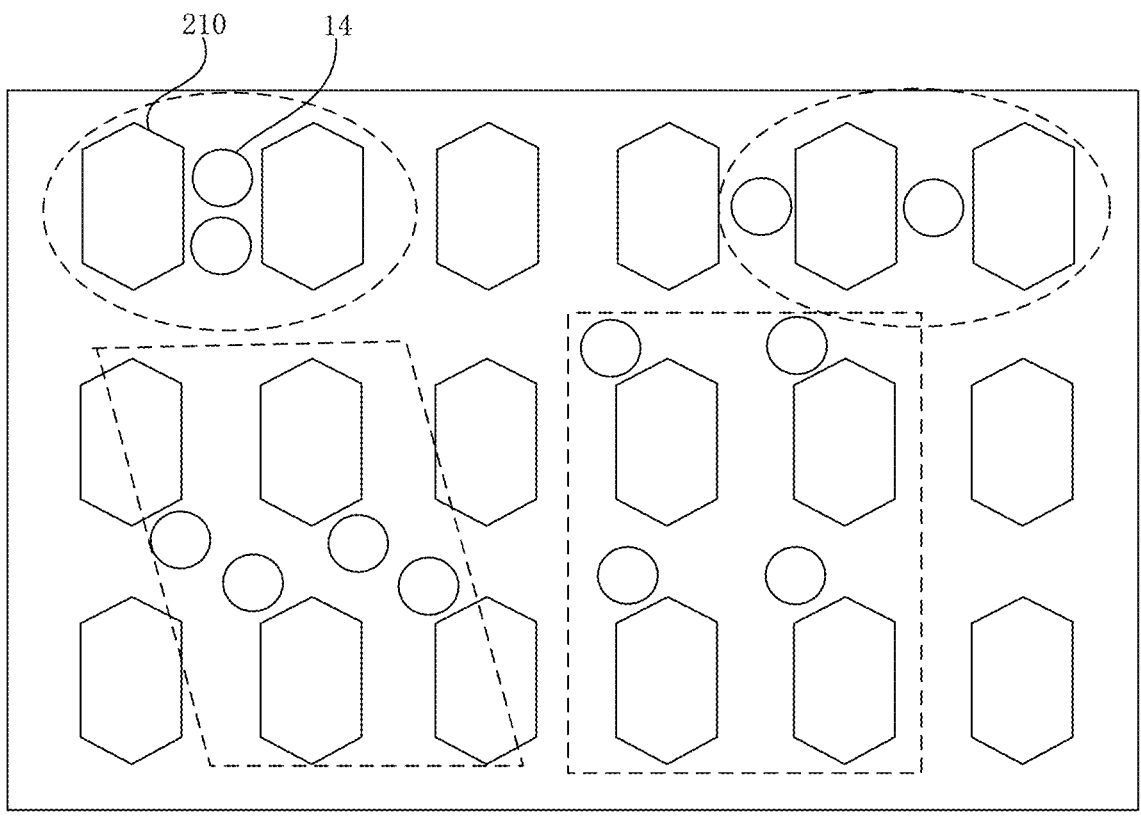
FIG. 7 is a schematic diagram illustrating a distribution of second via holes and first light-emitting patterns of a display substrate according to an embodiment of the present disclosure.

FIG. 7 is a schematic diagram illustrating a distribution of second via holes and first light-emitting patterns of a display substrate according to an embodiment of the present disclosure, referring to FIGS. 4 and 7, in some implementations, an opening is formed in the pixel defining layer 13, and the first light-emitting pattern 210 is located in the opening, an orthographic projection of the first via hole 12 on the base 1 is at least partially overlapped or not overlapped with the orthographic projection of the first light-emitting pattern 210 on the base 1, and an orthographic projection of the second via hole 14 on the base 1 is not overlapped with the orthographic projection of the first light-emitting pattern 210 on the base 1.

In some implementations, referring to FIG. 7, each pixel unit 2 is correspondingly provided with one second via hole 14, positions of orthographic projections of second via holes 14 of different pixel units 2 on the base 1 may be adjacent to each other, or may be opposite to each other, FIG. 7 shows four positions of the second via holes 14 with respect to the first light-emitting patterns 210, and the positions of the second via holes 14 with respect to the first light-emitting patterns 210 may be arranged in other modes, which are not listed here, as long as it is ensured that short-circuit connection does not occur between the second via holes 14 and the first light-emitting patterns 210.

In some implementations, referring to FIG. 7, the orthographic projections of the first via hole 12 and the second via hole 14 on the base 1 are both circular. The orthographic projections of the first via hole 12 and the second via hole 14 on the base 1 may also be in other shapes, such as a rectangle, a triangle, a trapezoid, or the like. The shape of the orthographic projection of the first light-emitting pattern 210 on the base 1 is a hexagon. The orthographic projection of the first light-emitting pattern 210 on the base 1 may also be in other shapes, such as a rectangle, a triangle, a pentagon, a trapezoid, a rhombus, or the like, and may be designed according to expectations on the display aperture ratio and resolution.

In some implementations, referring to FIG. 7, a diameter of the orthographic projection of the second via hole 14 on the base 1 ranges from 1 μm to 10 μm, too small diameter of the orthographic projection of the second via hole 14 on the base 1 may result in a relatively large resistance of a metal lap wire in the second via hole 14, and too large diameter of the orthographic projection of the second via hole 14 on the base 1 may cause an increased distance between the pixel units 2. The diameter, ranging from 1 μm to 10 μm, of the orthographic projection of the second via hole 14 on the base 1 can ensure that the resistance of the metal lap wire in the second via hole 14 does not exceed $10^5 \Omega$, thereby satisfying expectations on the resistance and the size of the metal lap wire in the second via hole 14.

In some implementations, referring to FIGS. 3 and 4, the display substrate further includes a frame area 102 surrounding the display area 101. The display substrate further includes a first potential line 15 and/or a second potential line 16, where the first potential line 15 and the second potential line 16 are located in the frame area 102, and the second electrode 213 and the fourth electrode 232 are respectively connected with the first potential line 15 or the second potential line 16.

In some implementations, referring to FIG. 4, the second electrode 213 is connected to the first potential line 15, and the fourth electrode 232 is connected to the second potential line 16. In this embodiment, the second electrode 213 and the fourth electrode 232 both cover the entire display area 101, so that the second electrode 213 directly extends to the frame area 102 and overlaps with the first potential line 15, and the fourth electrode 232 directly extends to the frame area 102 and overlaps with the second potential line 16.

In some implementations, referring to FIG. 5, colors of light emitted by the first light-emitting element 21, the second light-emitting element 22 and the third light-emitting element 23 are different. For the pixel units 2, the colors of light emitted by first light-emitting elements 21 are the same, the colors of light emitted by second light-emitting elements 22 are the same, and the colors of light emitted by third light-emitting elements 23 are the same. With such arrangement, the first light-emitting functional layer 212, the second light-emitting functional layer 221 and the third light-emitting functional layer 231 may extend to cover the entire display area 101, and the second electrode 213 and the fourth electrode 232 may extend to cover the entire display area 101, so that the process difficulty and the cost for manufacturing the display substrate are reduced.

Figure 8:
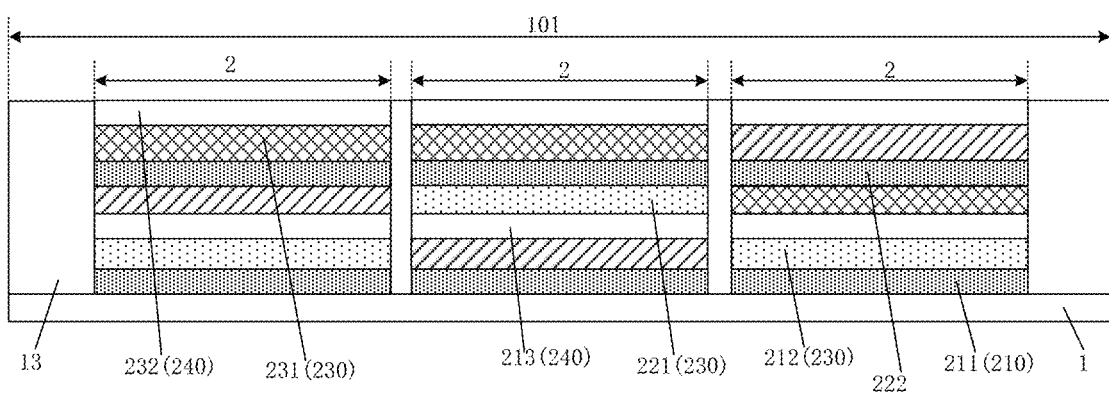
FIG. 8 is a schematic diagram of an arrangement of film layers in a display area of a display substrate according to an embodiment of the present disclosure.

FIG. 8 is a schematic diagram of an arrangement of film layers in a display area of a display substrate according to an embodiment of the present disclosure, as shown in FIG. 8, in some implementations, the first light-emitting element 21, the second light-emitting element 22 and the third light-emitting element 23 emit light with different colors, and for the pixel units 2, the colors of light emitted by part of the first light-emitting elements 21 are different, the colors of light emitted by part of the second light-emitting elements 22 are different, and the colors of light emitted by part of the third light-emitting elements 23 are different. That is, among at least part of different pixel units 2, the light-emitting elements that are vertically stacked in sequence in the direction perpendicular to the base 1 emit light with different colors, and the display substrate with such arranged film layers may be manufactured by forming the first light-emitting functional layer 212, the second light-emitting functional layer 221, and the third light-emitting functional layer 231 into the third pattern 230, respectively, and forming the second electrode 213 and the fourth electrode 232 into the fourth pattern 240, respectively.

Figure 9:
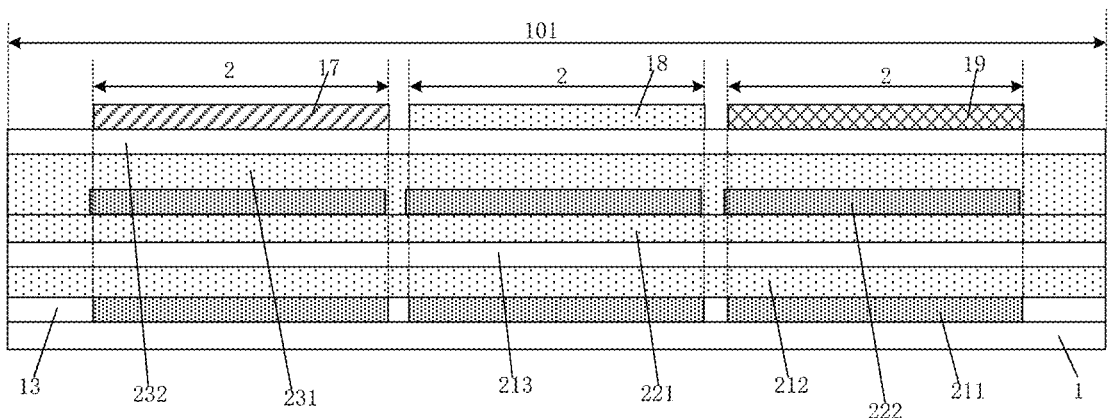
FIG. 9 is a schematic diagram of an arrangement of film layers in a display area of a display substrate according to an embodiment of the present disclosure.

FIG. 9 is a schematic diagram of an arrangement of film layers in a display area of a display substrate according to an embodiment of the present disclosure, in some implementations, the first light-emitting element 21, the second light-emitting element 22, and the third light-emitting element 23 emit light of the same color. For example, the first light-emitting element 21, the second light-emitting element 22 and the third light-emitting element 23 in the pixel unit 2 all emit white light or blue light.

In some implementations, referring to FIG. 9, the display substrate further includes a color filter layer located on a side of the light-emitting elements away from the base 1. The color filter layer includes a first color filter 17, a second color filter 18 and a third color filter 19, the first color filter 17, the second color filter 18 and the third color filter 19 have different colors, and the first color filter 17, the second color filter 18 and the third color filter 19 are respectively disposed corresponding to different pixel units 2. In some implementations, the first color filter 17, the second color filter 18 and the third color filter 19 are respectively disposed corresponding to any three pixel units 2 adjacent to each other. The first color filter 17, the second color filter 18 and the third color filter 19 may be a red filter, a green filter and a blue filter, respectively. Thus, color display of the display substrate can be realized.

In some implementations, the display substrate further includes an encapsulation layer (not shown) located on a side of the light-emitting elements away from the base for encapsulating the light-emitting elements.

The encapsulation layer may include an inorganic encapsulating layer and an organic encapsulating layer, the inorganic encapsulation layer and the organic encapsulation layer are sequentially stacked to encapsulate the light-emitting elements to effectively prevent external moisture and oxygen from invading the display substrate, so that the light-emitting elements in the display substrate can be prevented from being damaged by the external moisture and oxygen, and the quality of the display substrate is ensured.

Based on the foregoing structure of the display substrate, in a second aspect, an embodiment of the present disclosure further provides a method for manufacturing a display substrate, where the method includes: preparing a plurality of pixel units on a base, the preparing a plurality of pixel unit includes: firstly, preparing a pixel driving circuit on the base; then preparing light-emitting elements on a side of the pixel driving circuit away from the base, where at least two light-emitting elements in each pixel unit are sequentially prepared in a direction away from the base to form a stacked structure of the at least two light-emitting elements in each pixel unit.

Figure 10A:
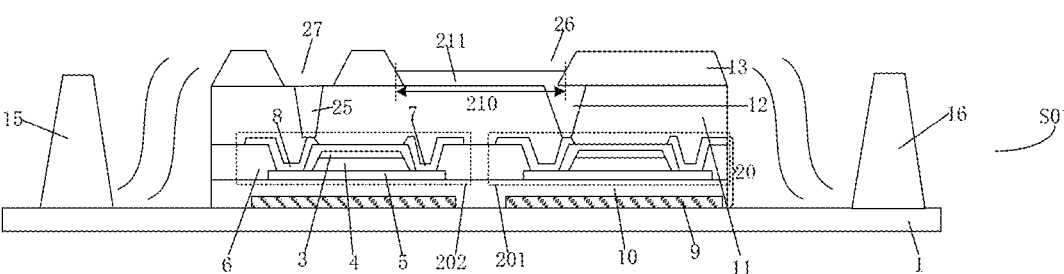
FIG. 10A is a schematic diagram of forming a pixel driving circuit, a first potential line, a second potential line, a first insulating layer, a pattern of a first via hole and a pattern of a third via hole in the first insulating layer, a pattern of a first electrode, a pixel defining layer, and an opening and a pattern of a fourth via hole in the pixel defining layer on a base.
Figure 10B:
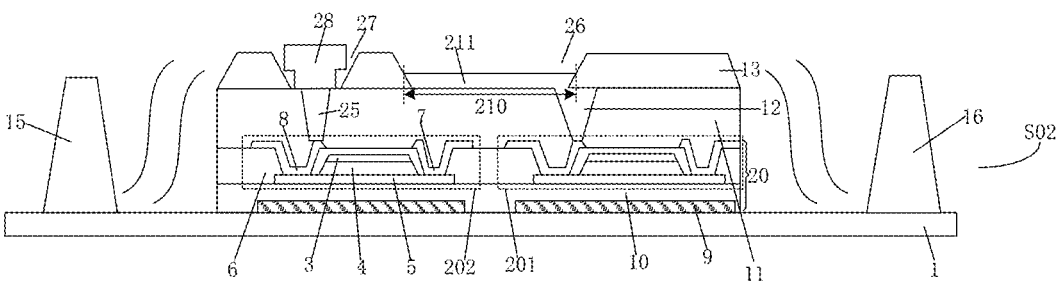
FIG. 10B is a schematic diagram of forming a first isolation pillar on a base.
Figure 10C:
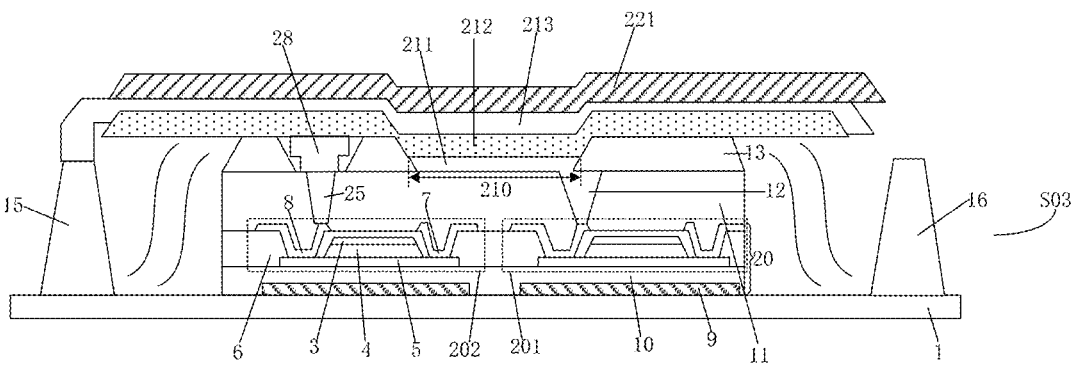
FIG. 10C is a schematic diagram of forming a first light-emitting functional layer, a second electrode, and a second light-emitting functional layer on a base.
Figure 10D:
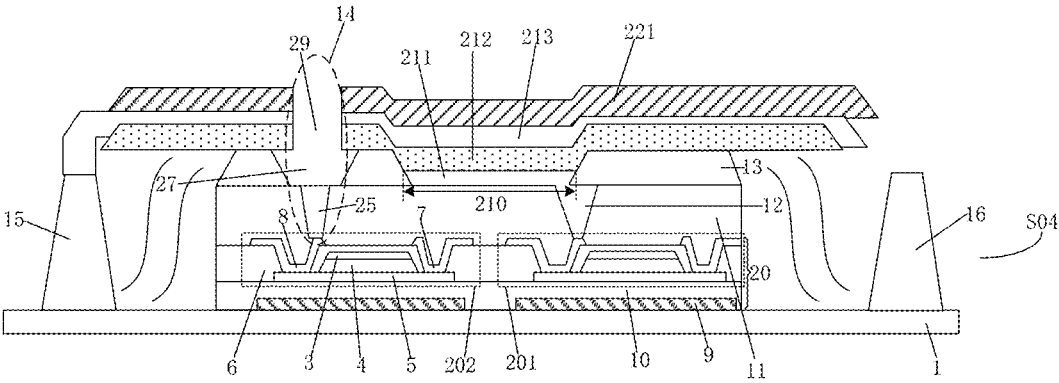
FIG. 10D is a schematic diagram of forming a fifth via hole.
Figure 10E:
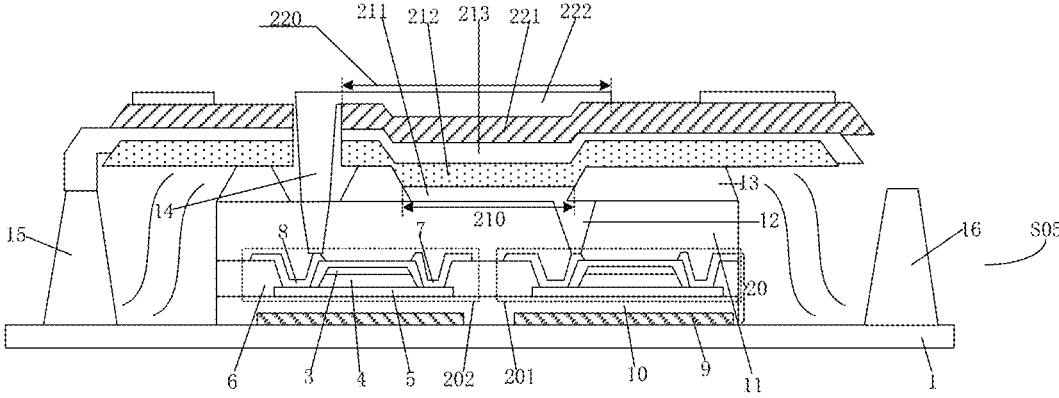
FIG. 10E is a schematic diagram of forming a pattern of a third electrode on a base.
Figure 10F:
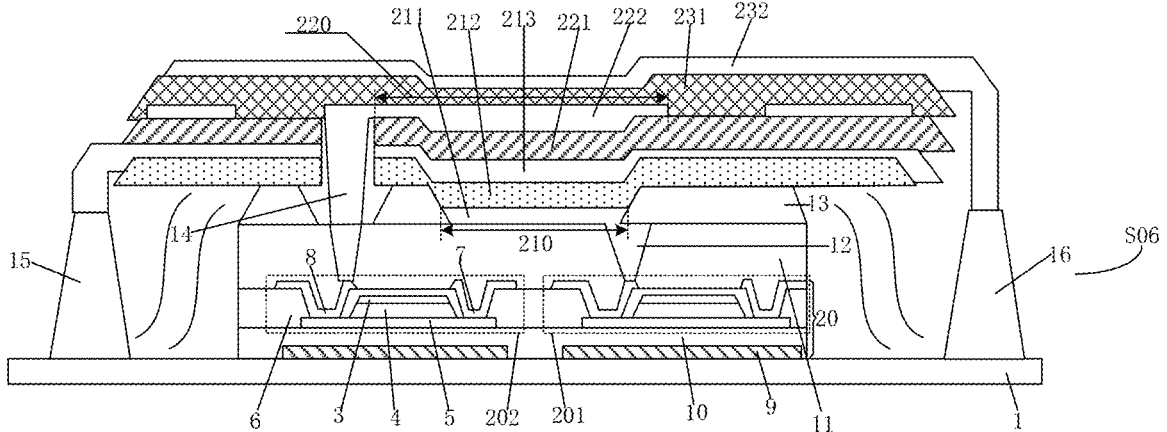
FIG. 10F is a schematic diagram of forming a third light-emitting functional layer and a fourth electrode on a base.

In some implementations, a method for manufacturing the display substrate shown in FIGS. 4 and 5 may refer to FIGS. 10A to 10F, FIG. 10A is a schematic diagram of forming a pixel driving circuit, a first potential line, a second potential line, a first insulating layer, patterns of a first via hole and a third via hole in the first insulating layer, a pattern of a first electrode, a pixel defining layer, and patterns of an opening and a fourth via hole in the pixel defining layer on a base; FIG. 10B is a schematic diagram of forming a first isolation pillar on the base, FIG. 10C is a schematic diagram of forming a first light-emitting functional layer, a second electrode, and a second light-emitting functional layer on the base, FIG. 10D is a schematic diagram of forming a fifth via hole, FIG. 10E is a schematic diagram of forming a pattern of a third electrode on the base, and FIG. 10F is a schematic diagram of forming a third light-emitting functional layer and a fourth electrode on the base. The method for manufacturing the display substrate includes the following steps S01 to S06.

At step S01, after preparing the pixel driving circuit 20, a first potential line 15 and a second potential line 16 on the base 1, sequentially preparing a first insulating layer 11 and patterns of a first via hole 12 and a third via hole 25 in the first insulating layer 11, a pattern of a first electrode 211, a pixel defining layer 13 and patterns of an opening 26 and a fourth via hole 27 in the pixel defining layer on the base 1, where a first light-emitting pattern 210 in the first electrode 211 is located in the opening 26, and a material of the first electrode 211 is filled in the first via hole 12 and the third via hole 25.

In this step, the patterns of the film layers in the pixel driving circuit 20, the first potential line 15, the second potential line 16, the first insulating layer 11 and patterns of the first via hole 12 and the third via hole 25 in the first insulating layer, the pattern of the first electrode 211, the pixel defining layer 13 and the patterns of the opening 26 and the fourth via hole 27 in the pixel defining layer 13 are respectively prepared by a patterning process (including steps of film formation, exposure, development, etching, and the like). The material of the first electrode 211 may be an opaque metal material. The first potential line 15 and the second potential line 16 are formed simultaneously during forming a light blocking layer 9, a gate electrode 3, a source electrode 7 and a drain electrode 8, that is, the first potential line 15 and the second potential line 16 may be respectively formed by laminated film layers of the light blocking layer 9, the gate electrode 3 and the source electrode 7

At step S02, preparing a first isolation pillar 28 on the base 1 subjected to the step S01, where the first isolation pillar 28 is formed in the fourth via hole 27.

Figure 11:
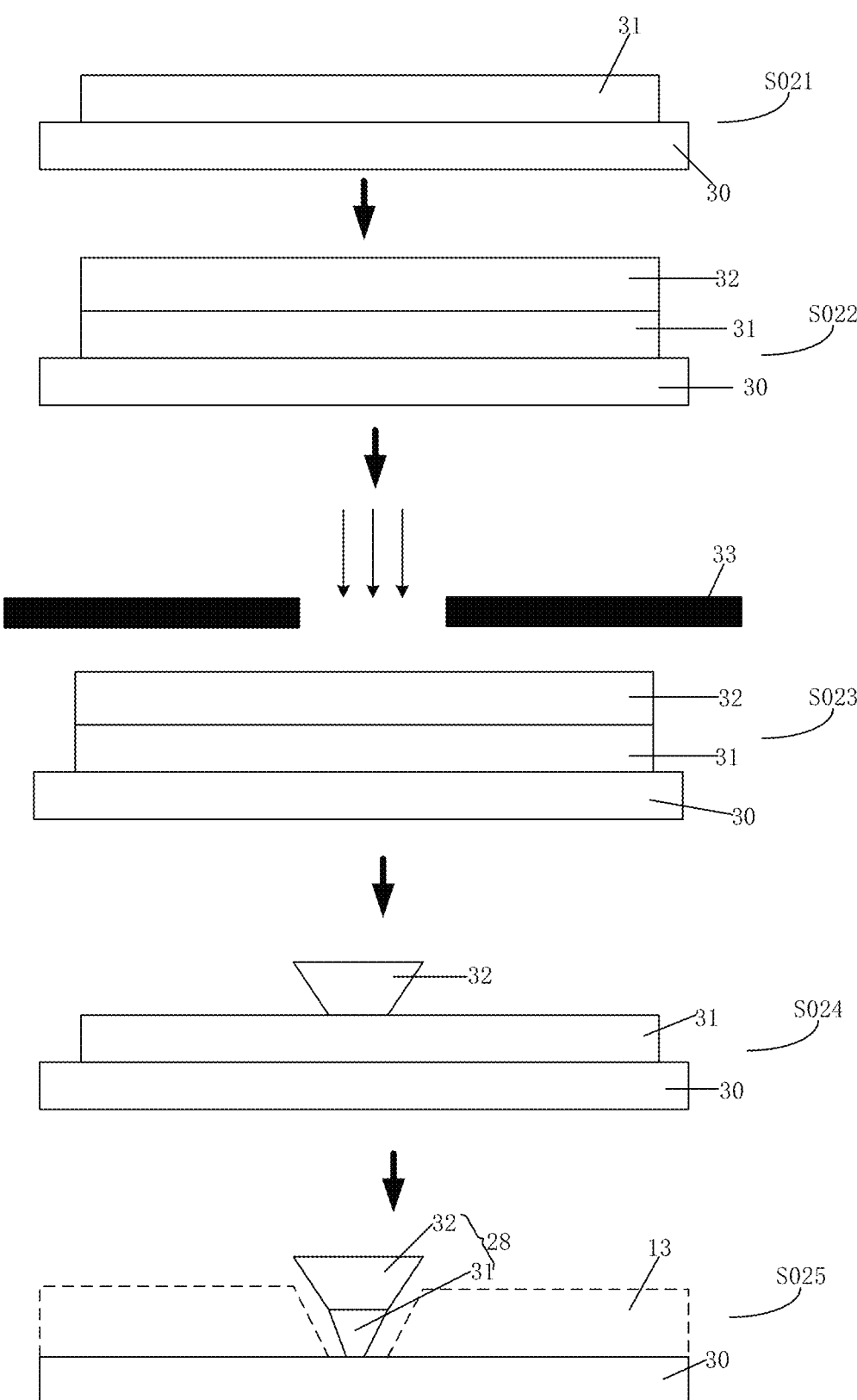
FIG. 11 is a schematic diagram of a process for manufacturing a first isolation pillar.

This step specifically includes the following steps S021 to S025, and FIG. 11 is a schematic diagram of forming the first isolation pillar.

At step S021, coating a sacrificial layer 31 on the base (simplified to a first substrate 30) formed with the first insulating layer, patterns of the first via hole and the third via hole in the first insulating layer, the pattern of the first electrode, and the pixel defining layer and patterns of the opening and the fourth via hole in the pixel defining layer, and then drying the sacrificial layer.

At step S022, forming a photoresist layer 32 on the base subjected to the step S021, and drying the photoresist layer.

At step S023, exposing the photoresist layer 32 by using a mask 33 including a pattern of the first isolation pillar.

At step S024, developing and then removing a portion of the photoresist layer in a region other than a region corresponding to the pattern of the first isolation pillar, and reserving a portion of the photoresist layer 32 in the region corresponding to the pattern of the first isolation pillar.

A shape of a cross-section of the reserved portion of the photoresist layer 32 perpendicular to the first substrate 30 is an inverted trapezoid.

At step S025, developing again and then removing a portion of the sacrificial layer in a region other than the region corresponding to the pattern of the first isolation pillar, and reserving a portion of the sacrificial layer 31 in the region corresponding to the pattern of the first isolation pillar.

Figure 12:
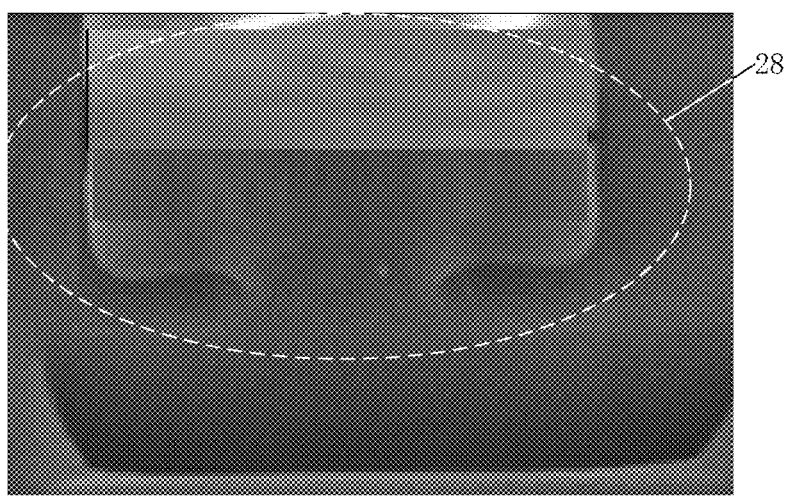
FIG. 12 is a diagram of an outline of a first isolation pillar.

A shape of a cross-section of the reserved portion of the sacrificial layer 31 perpendicular to the substrate 30 is an inverted trapezoid. FIG. 12 shows a diagram of an outline of the first isolation pillar, the reserved portions of the photoresist layer 32 and the sacrificial layer 31 jointly form the first isolation pillar 28, a shape of a cross-section of the first isolation pillar 28 perpendicular to the substrate 30 is also an inverted trapezoid, and a surface of the first isolation pillar 28 away from the base 1 is higher than a surface of the pixel defining layer 13 away from the base 1, so that subsequent peeling of the first isolation pillar 28 and a portion of a film layer formed thereon is facilitated.

In some implementations, a shape of a cross-section of the first isolation pillar 28 perpendicular to the base 1 is an inverted trapezoid, a dimension of the first isolation pillar 28 at a longer upper base side of the inverted trapezoid in a direction perpendicular to the base 1 ranges from 1 μm to 10 μm. In such way, the diameter of the orthographic projection of the second via hole on the base 1 is ensured to range from 1 μm to 10 μm.

At step S03, sequentially preparing a first light-emitting functional layer 212, a second electrode 213 and a second light-emitting functional layer 221 on the base 1 subjected to the step S02, where the second electrode 213 overlaps with the first potential line 15.

In this step, the first light-emitting functional layer 212, the second electrode 213, and the second light-emitting functional layer 221 each are formed into an entire surface structure by evaporation using an Open mask. The second electrode 213 may adopt a structure of dielectric/metal/dielectric, such as a structure of MoO₃ (molybdenum trioxide)/MgAg/MoO₃; the second electrode 213 with such structure may be formed layer by layer by using an evaporation process. Certainly, the second electrode 213 may also be made of transparent conductive material such as MgAg, ITO (indium tin oxide), or IZO (indium zinc oxide), but the second electrode 213 made of ITO or IZO is to be prepared through a patterning process (including steps of film formation, exposure, development, and etching), and the etching is likely to damage the first light-emitting functional layer 212 that is already formed.

At step S04, soaking the base 1 subjected to the step S03 in a peeling solution, and peeling off the first isolation pillar and portions of the first light-emitting functional layer, the second electrode and the second light-emitting functional layer formed on the first isolation pillar, and forming a fifth via hole 29 penetrating through the second light-emitting functional layer 221, the second electrode 213 and the first light-emitting functional layer 212, where the fifth via hole 29, the fourth via hole 27, and the third via hole 25 are communicated to form the second via hole 14.

In this step, the base 1 subjected to above steps is soaked in the peeling solution under an N₂ (nitrogen) environment, and the sacrificial layer in the first isolation pillar is separated from the film layer, to which the sacrificial layer is attached, in the peeling solution, so that the first light-emitting functional layer (including HTL/HIL/EML/ETL/EIL), the second electrode, and the second light-emitting functional layer (including HTL/HIL/EML/ETL/EIL) attached to the first isolation pillar are peeled off, and a connection hole (i.e., the second via hole 14) for connecting the third electrode with the pixel driving circuit is exposed.

At step S05, preparing a pattern of a third electrode 222 on the base 1 subjected to the step S04, where the third electrode 222 is connected to the pixel driving circuit 20 through the second via hole 14.

In this step, the pattern of the third electrode 222 is formed by evaporation using a mask (i.e., FMM, fine metal mask) having an openings with the pattern of the third electrode 222. The third electrode 222 may employ a structure of dielectric/metal/dielectric, such as a structure of MoO₃ (molybdenum trioxide)/MgAg/MoO₃; the third electrode 222 with such structure may be formed layer by layer using an evaporation process. Certainly, the third electrode 222 may also be made of transparent conductive material such as MgAg, ITO (indium tin oxide), or IZO (indium zinc oxide), but the third electrode 222 made of ITO or IZO is to be prepared through a patterning process (including steps of film formation, exposure, development, and etching), and the etching is likely to damage the second light-emitting functional layer 221 that is already formed.

At step S06, sequentially preparing a third light-emitting functional layer 231 and a fourth electrode 232 on the base 1 subjected to the step S05, where the fourth electrode 232 is overlaps with the second potential line 16.

In this step, each of the third light-emitting functional layer 231 and the fourth electrode 232 is formed into an entire-surface structure by evaporation using an Open mask. The fourth electrode 232 may adopt a structure of dielectric/metal/dielectric structure, such as a structure of MoO₃ (molybdenum trioxide)/MgAg/MoO₃; the fourth electrode 232 with such structure may be formed layer by layer by using an evaporation process. Certainly, the fourth electrode 232 may also be made of transparent conductive material such as MgAg, ITO (indium tin oxide), or IZO (indium zinc oxide), but the fourth electrode 232 made of ITO or IZO is to be prepared through a patterning process (including steps of film formation, exposure, development, and etching), and the etching is likely to damage the third light-emitting functional layer 231 that is already formed.

Figure 13A:
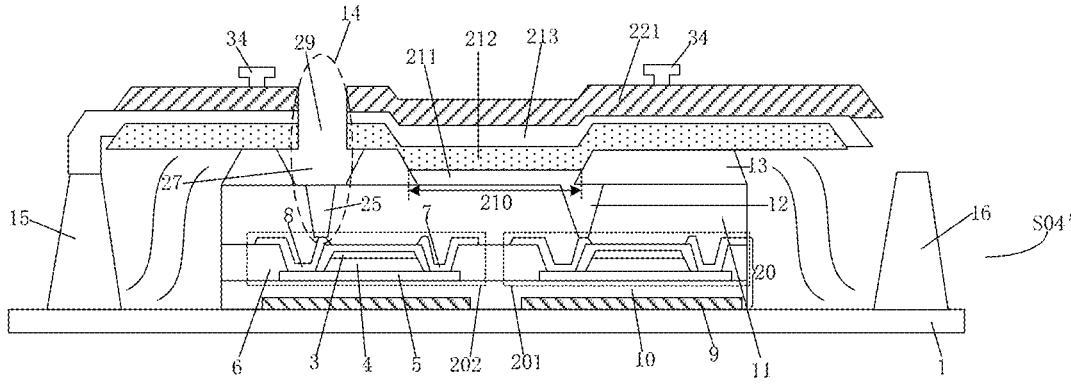
FIG. 13A is a schematic diagram of forming a second isolation pillar on a base.
Figure 13B:
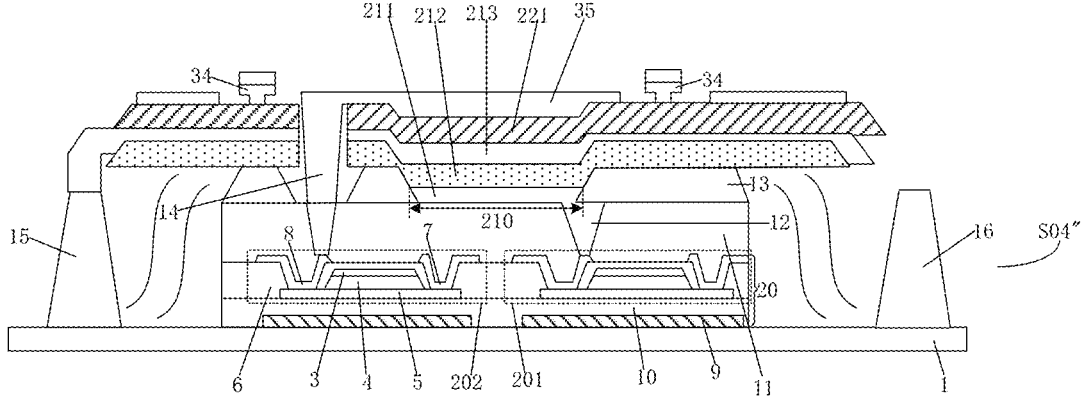
FIG. 13B is a schematic diagram of forming a film layer for forming a third electrode on a base.
Figure 13C:
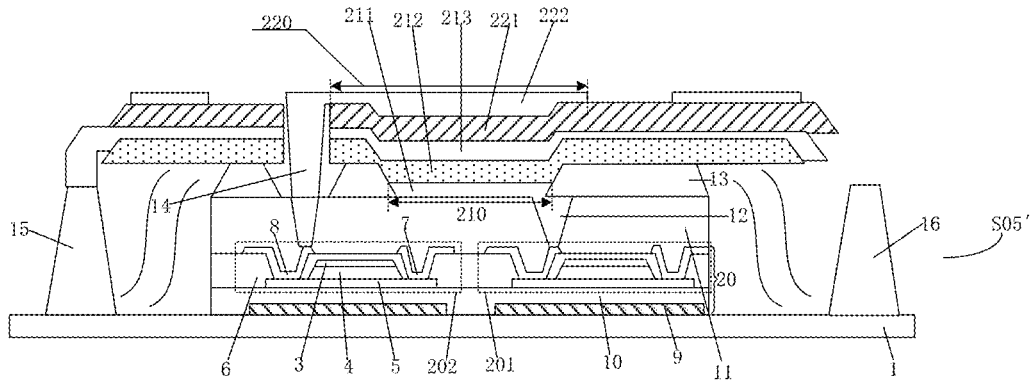
FIG. 13C is a schematic diagram of peeling off a second isolation pillar and forming a pattern of a third electrode.

FIG. 13A is a schematic diagram of forming a second isolation pillar on the base, FIG. 13B is a schematic diagram of forming a film layer for forming the third electrode on the base, and FIG. 13C is a schematic diagram of peeling off the second isolation pillar and forming a pattern of the third electrode, in some implementations, after the step S04 of peeling off the first isolation pillar and the portions of the first light-emitting functional layer, the second electrode and the second light-emitting functional layer formed on the first isolation pillar, and before the step S05 of preparing the pattern of the third electrode, the method further includes steps S04', S04" and S05'.

At step S04', preparing a second isolation pillar 34 disposed surrounding the pattern of the third electrode.

In this step, the method for preparing the second isolation pillar 34 is the same as the method for preparing the first isolation pillar, and is not described herein again.

At step S04", forming a film layer 35, for forming the third electrode, on the base 1 subjected to the step S04'.

In this step, the film layer 35 for forming the third electrode is formed into an entire-surface structure by evaporation using an Open mask.

At step S05', soaking the base 1 subjected to the step S04" in a peeling solution, and peeling off the second isolation pillar and a portion of the film layer, for forming the third electrode, formed on the second isolation pillar to form a pattern of the third electrode 222.

Figure 14:
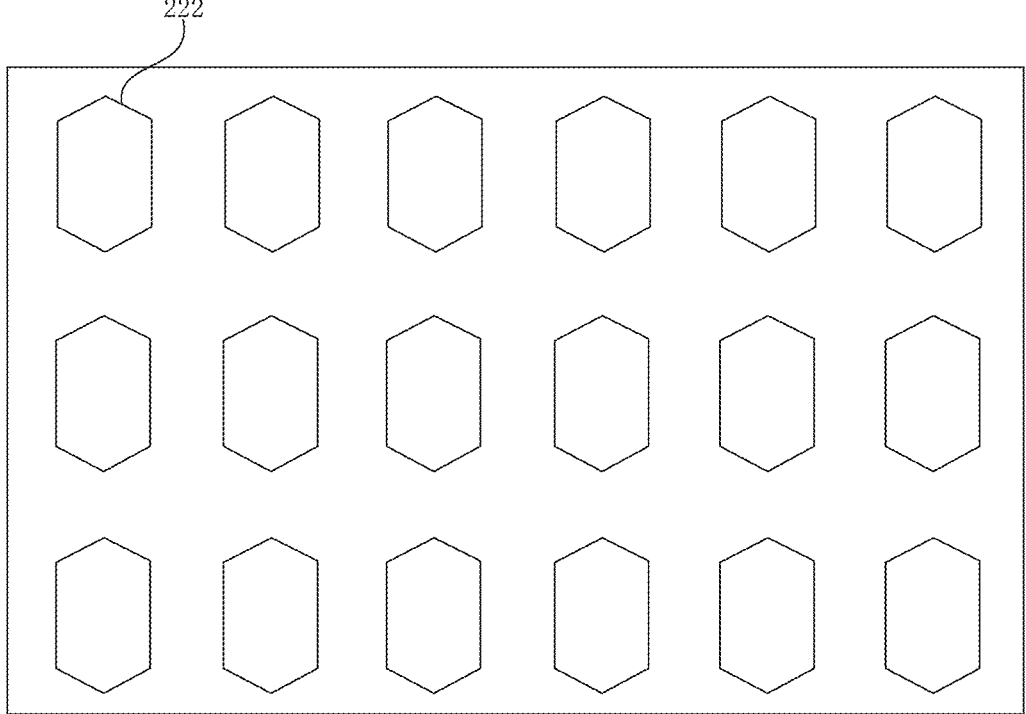
FIG. 14 is a schematic top view of a pattern of a third electrode.

In this step, the base 1 subjected to above steps is soaked in the peeling solution under an $N_2$ (nitrogen) environment, and the sacrificial layer in the second isolation pillar is separated from the film layer, to which the second isolation pillar is attached, in the peeling solution, so that a portion of the film layer, for forming the third electrode, attached to the second isolation pillar is peeled off, and the pattern of the third electrode 222 is formed, for example, FIG. 14 shows a schematic top view of the pattern of the third electrode.

The method for manufacturing the display substrate provided by the embodiment of the present disclosure has reduced process difficulty and cost.

In the display substrate provided by the embodiment of the present disclosure, at least two light-emitting elements in each pixel unit are sequentially stacked in the direction away from the base, so that it can be achieved that at least part of the light-emitting elements in the pixel unit are stacked in a direction perpendicular to the base 1 to form a vertical arrangement structure; compared with the structure that the sub-pixels in the pixel are sequentially arranged side by side in the related art, an area of a region of the display area occupied by each pixel unit can be reduced, so that on one hand, for a transparent display substrate which expects to reduce the aperture ratio of the display area to improve the area of the transparent display area, the aperture ratio of the display area can be well reduced to improve the area of the transparent display area, and further the transmittance of a display product is improved; on the other hand, for a display substrate expecting to increase the resolution to implement micro-display (such as AR augmented reality and VR virtual reality), the reduction of the area of the region of the display area occupied by each pixel unit is beneficial to arranging more pixel units in the vacated region of the display area, so as to improve the resolution of the display substrate for implementing micro-display, and further improve the display effect of the display substrate.

In a third aspect, an embodiment of the present disclosure further provides a method for driving the display substrate, where the light-emitting elements sequentially stacked in the direction away from the base in each pixel unit are driven by the pixel driving circuit to emit light simultaneously.

Figure 15:
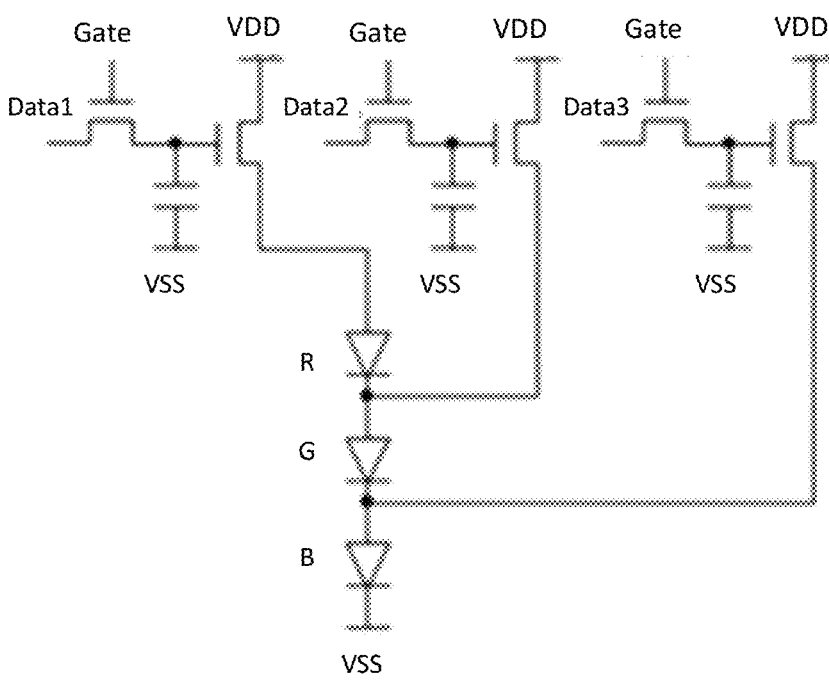
FIG. 15 is a circuit diagram of a pixel driving circuit of a pixel unit in a display substrate according to an embodiment of the present disclosure.
Figure 16:
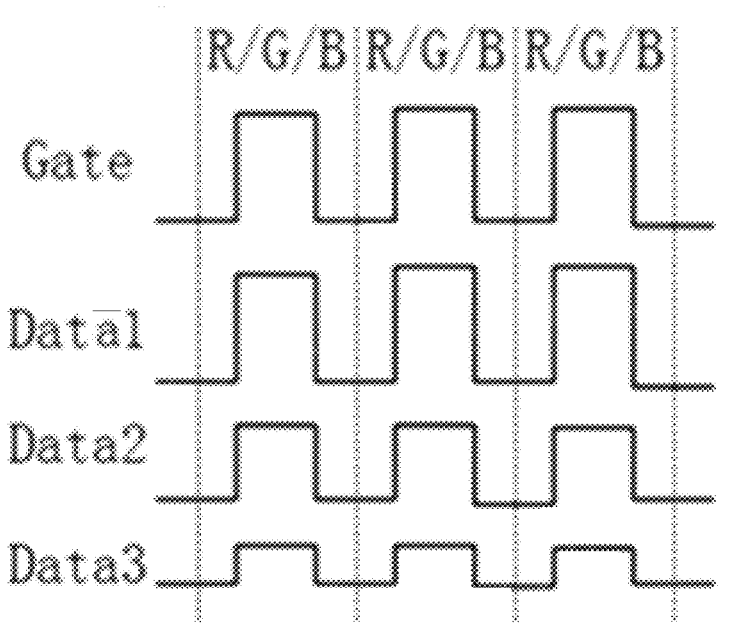
FIG. 16 is a timing diagram of the pixel driving circuit in FIG. 15 driving light-emitting elements to emit light.

FIG. 15 is a circuit diagram of a pixel driving circuit of a pixel unit in a display substrate according to an embodiment of the present disclosure, FIG. 16 is a timing diagram of the pixel driving circuit in FIG. 15 driving light-emitting elements to emit light, as shown in FIG. 15, the pixel driving circuit has a circuit structure of 6T3C; four signal lines, including a gate line, a Data1 line, a Data2 line and a Data3 line, are provided in the pixel driving circuit, where the Data1 line, the Data2 line, and the Data3 line supply data signals to a red (R) light-emitting element, a green (G) light-emitting element, and a blue (B) light-emitting element for emitting light, respectively. Referring to FIG. 16, the pixel driving circuit drives the red (R) light-emitting element, the green (G) light-emitting element, and the blue (B) light-emitting element in the pixel unit to emit light simultaneously, where VSS in the pixel driving circuit is a ground potential, that is, a zero potential. A voltage difference between an anode and a cathode of the blue light-emitting element is V(B), where V(B) is equal to a data voltage Data3 of the Data3 line, that is, V(B)=Data3; a voltage difference between an anode and a cathode of the green light-emitting element is V(G), where V(G)=Data2−Data3, Data2 being a data voltage of the Data2 line, and a voltage difference between an anode and a cathode of the red light-emitting element is V(R), where V(R)=Data1−Data2, Data1 being a data voltage of the Data1 line.

In some implementations, the light-emitting elements sequentially stacked in a direction away from the base in each pixel unit are driven by the pixel driving circuit to emit light in a time-sharing manner.

Figure 17:
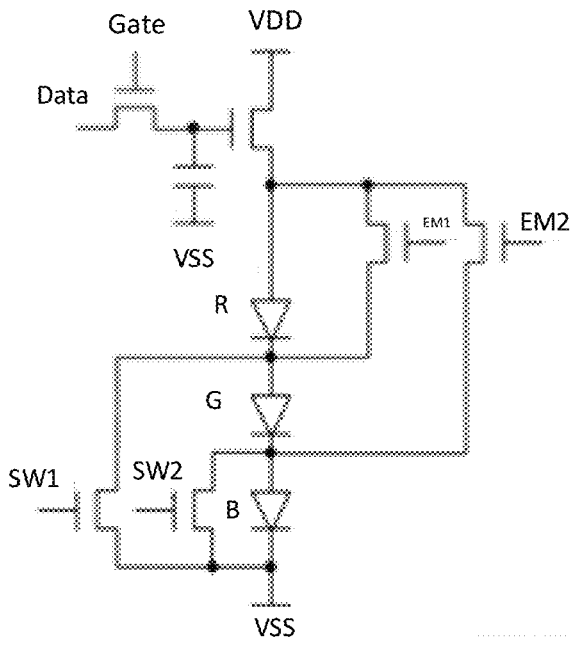
FIG. 17 is a circuit diagram of a pixel driving circuit of a pixel unit in a display substrate according to an embodiment of the present disclosure.
Figure 18:
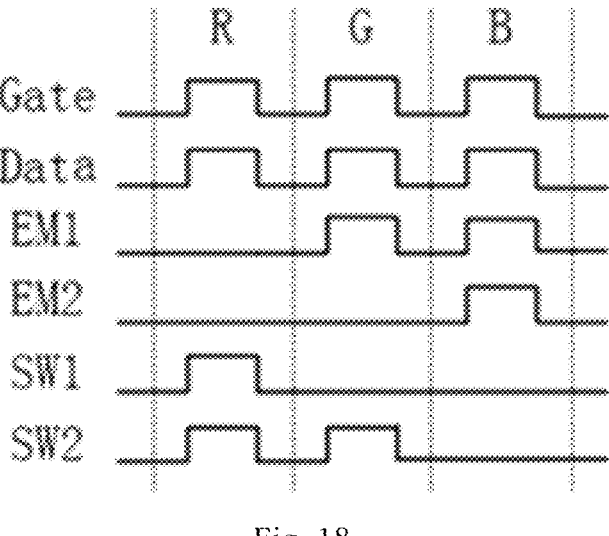
FIG. 18 is a timing diagram of the pixel driving circuit in FIG. 17 driving light-emitting elements to emit light.

FIG. 17 is a circuit diagram of another pixel driving circuit of a pixel unit in a display substrate according to an embodiment of the present disclosure, FIG. 18 is a timing diagram of the pixel driving circuit in FIG. 17 driving the light-emitting elements to emit light, as shown in FIG. 17, the pixel driving circuit has a circuit structure of 6T1C, six signal lines, including a gate line, a Data line, a EM1 line, a EM2 line, a SW1 line, and a SW2 line, are provided in the pixel driving circuit, where the data line provides data signals to the red (R) light-emitting element, the green (G) light-emitting element and the blue (B) light-emitting element for emitting light in a time-sharing manner, the EM1 line and the EM2 line control writing of voltages to anodes of the green light-emitting element and the blue light-emitting element, respectively, and the SW1 line and the SW2 line control writing of voltages to cathodes of the red light-emitting element and the green light-emitting element, respectively. VSS in the pixel driving circuit is a ground potential, that is, a zero potential. Referring to FIG. 18, the pixel driving circuit drives the red (R) light-emitting element, the green (G) light-emitting element, and the blue (B) light-emitting element in the pixel unit to emit light in a time-sharing manner.

Figure 19:
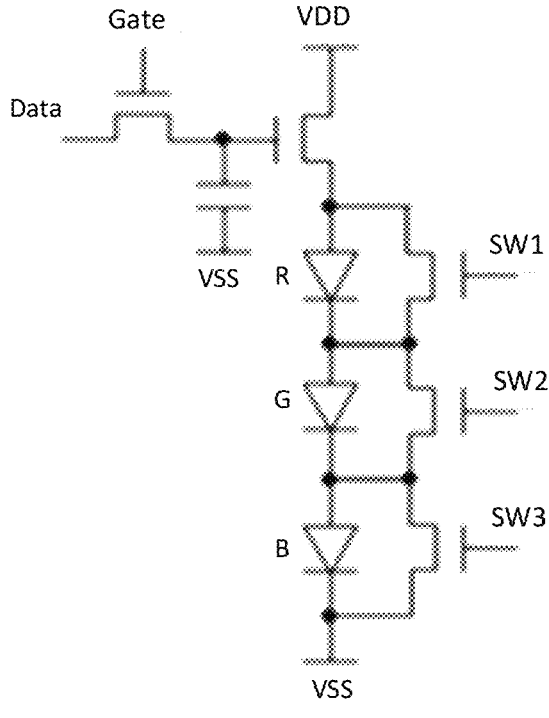
FIG. 19 is a circuit diagram of a pixel driving circuit of a pixel unit in a display substrate according to an embodiment of the present disclosure.
Figure 20:
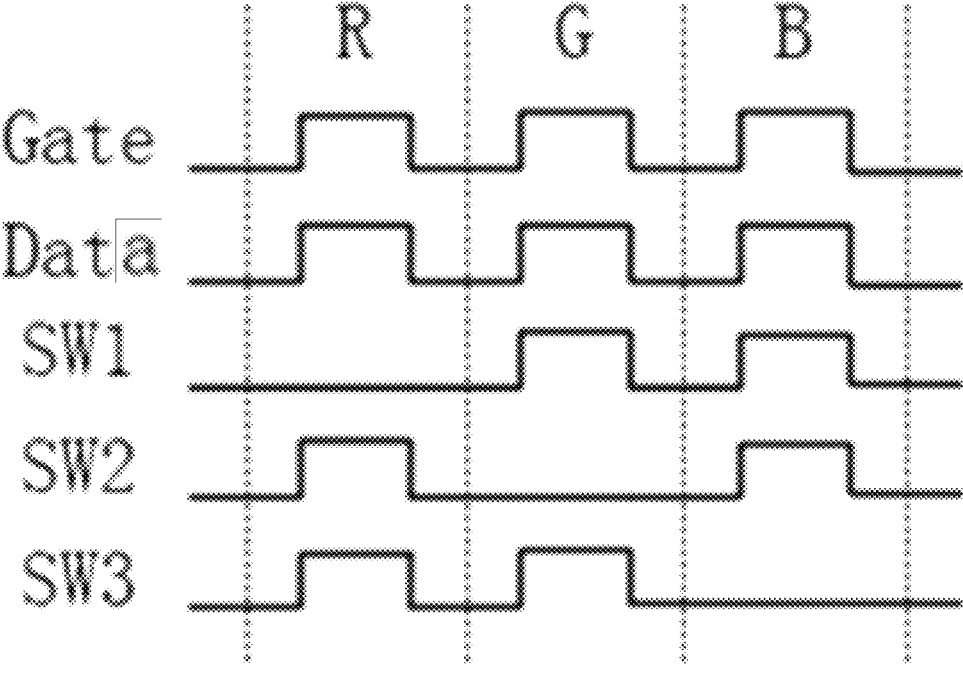
FIG. 20 is a timing diagram of the pixel driving circuit in FIG. 19 driving light-emitting elements to emit light.

FIG. 19 is a circuit diagram of another pixel driving circuit of a pixel unit in a display substrate according to an embodiment of the disclosure, FIG. 20 is a timing diagram of the pixel driving circuit in FIG. 19 driving the light-emitting elements to emit light, in some implementations, as shown in FIG. 19, the pixel driving circuit has a circuit structure of 5T1C, five signal lines, including a gate line, a Data line, a SW1 line, a SW2 line, and a SW3 line, are provided in the pixel driving circuit, where the Data line provides data signals to the red (R) light-emitting element, the green (G) light-emitting element and the blue (B) light-emitting element for emitting light in a time-sharing manner, the SW1 line, the SW2 line and the SW3 line control writing of voltages to anodes and cathodes of the red light-emitting element, the green light-emitting element and the blue light-emitting element, respectively, and VSS in the pixel driving circuit is a ground potential, that is, a zero potential. Referring to FIG. 20, the pixel driving circuit drives the red (R) light-emitting element, the green (G) light-emitting element and the blue (B) light-emitting element in the pixel unit to emit light in a time-sharing manner.

Figure 21:
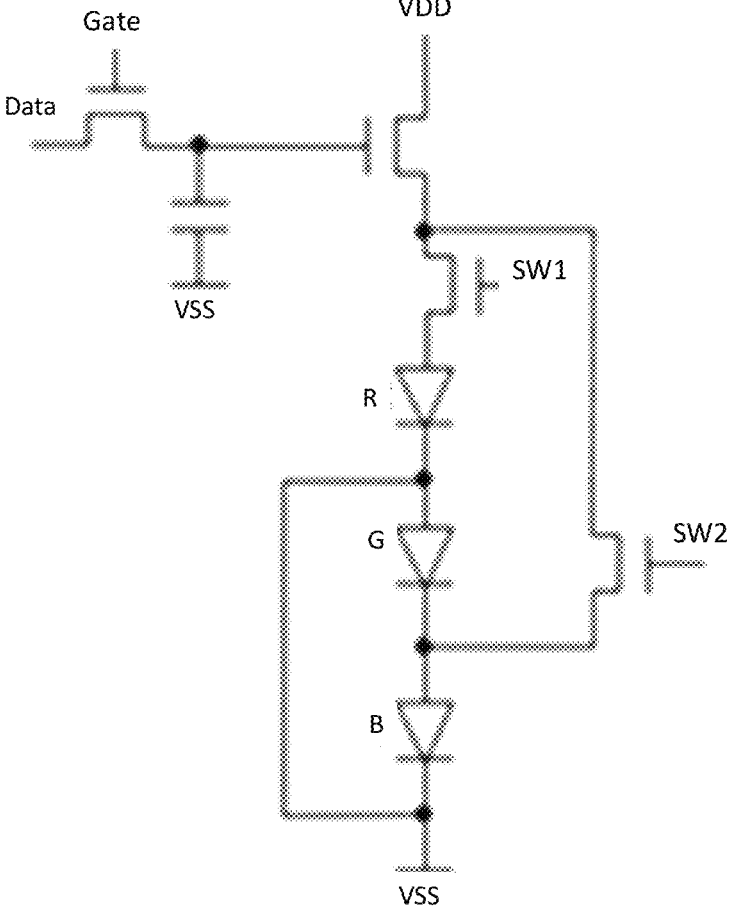
FIG. 21 is a circuit diagram of a pixel driving circuit of a pixel unit in a display substrate according to an embodiment of the present disclosure.
Figure 22:
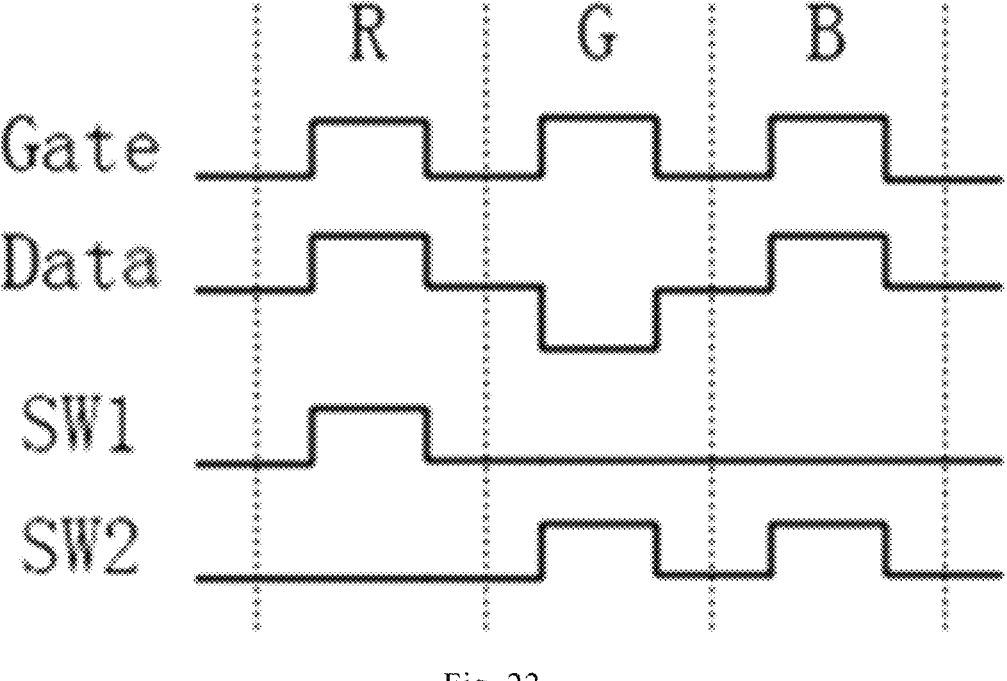
FIG. 22 is a timing diagram of the pixel driving circuit in FIG. 21 driving light-emitting elements to emit light.

FIG. 21 is a circuit diagram of another pixel driving circuit of a pixel unit in a display substrate according to an embodiment of the present disclosure, and FIG. 22 is a timing diagram of the pixel driving circuit in FIG. 21 driving the light-emitting elements to emit light, in some implementations, as shown in FIG. 21, the pixel driving circuit has a circuit structure of 4T1C, four signal lines, including a gate line, a Data line, a SW1 line and a SW2 line, are provided in the pixel driving circuit. The Data line provides data signals to the red (R) light-emitting element, the green (G) light-emitting element and the blue (B) light-emitting element for emitting light in a time-sharing manner, specifically, the Data line provides a positive voltage to control the red light emitting element and the blue light emitting element to emit light, or the Data line provides a negative voltage to control the green light emitting element to emit light. The SW1 line and the SW2 line control writing of voltages to the anodes and cathodes of the red light-emitting element, the green light-emitting element, and the blue light-emitting element, respectively. VSS in the pixel driving circuit is a ground potential, that is, a zero potential. Referring to FIG. 22, the pixel driving circuit drives the red (R) light-emitting element, the green (G) light-emitting element and the blue (B) light-emitting element in the pixel unit to emit light in a time-sharing manner.

Figure 23:
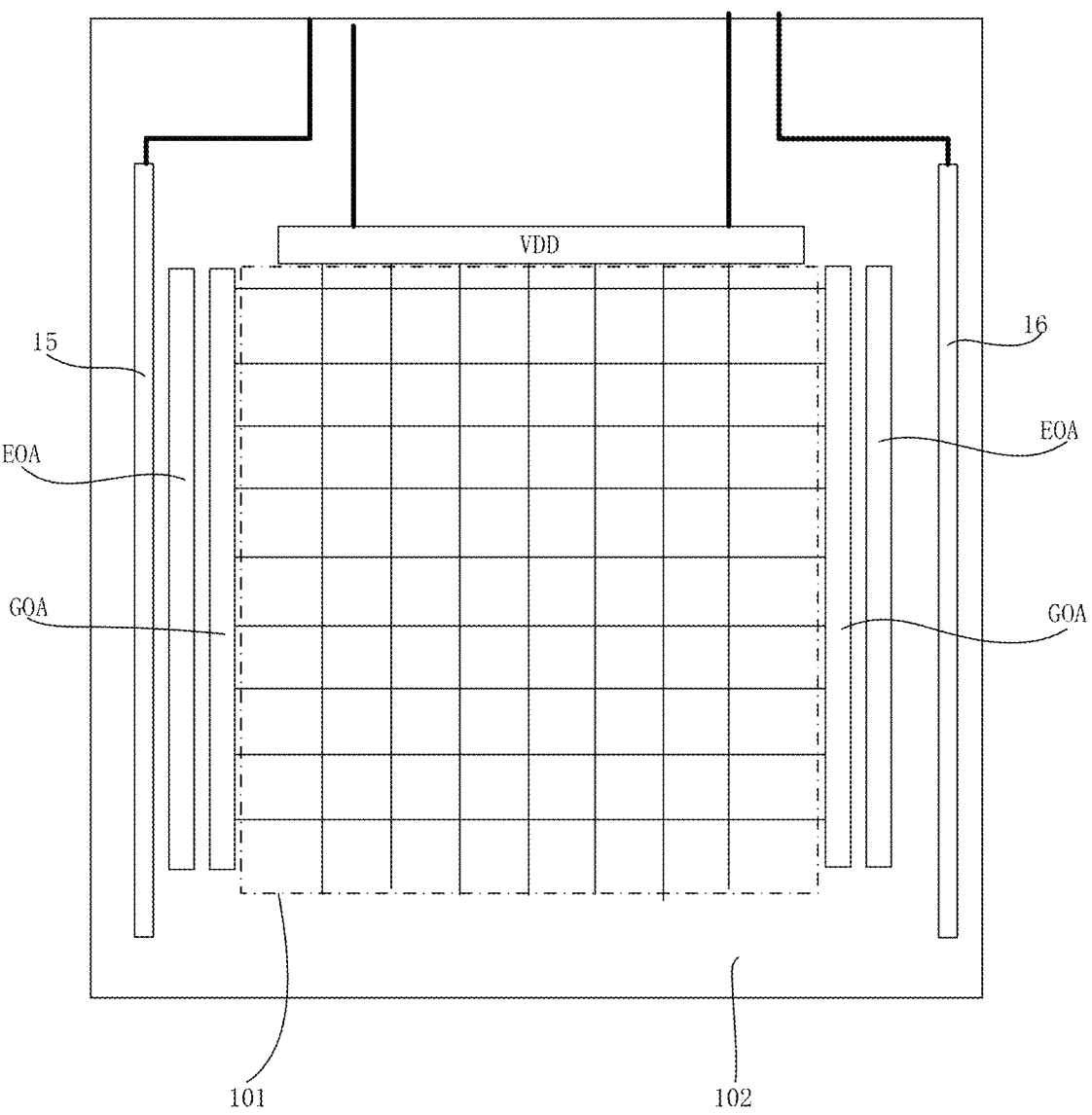
FIG. 23 is a schematic diagram of wiring on a display substrate according to an embodiment of the present disclosure.

FIG. 23 is a schematic diagram of wiring on a display substrate according to an embodiment of the present disclosure, in some implementations, referring to FIG. 23, the frame area 102 of the display substrate is provided therein with a gate driving circuit, such as an light emission control gate driving circuit (e.g., emission driver on array, EOA) and a data writing gate driving circuit (e.g., gate driver on array, GOA), and the gate driving circuit is connected to the pixel driving circuit in the display area 101 for controlling the pixel driving circuit to operate. The first potential line 15 and the second potential line 16 are respectively located in portions of the frame area 102 at two opposite sides of the display substrate, and are respectively overlapped with the second electrode and the fourth electrode located in the display area 101. The first potential line 15 and the second potential line 16 may be grounded, respectively.

According to the method for driving the display substrate provided by the embodiment of the present disclosure, the light-emitting elements vertically stacked in the pixel unit can be driven simultaneously or in a time-sharing manner, so that normal display of the display substrate is realized.

In a fourth aspect, an embodiment of the present disclosure further provides a display panel, which includes the display substrate described above.

By adopting the display substrate in the above embodiment, the display panel can display with high-transmittance and high-resolution, so that the display effect of the display panel is improved.

In a fifth aspect, an embodiment of the present disclosure further provides a display device, which includes the display panel described above.

By adopting the display panel in the above embodiment, the display device can display with high-transmittance and high-resolution, so that the display effect of the display device is improved.

The display device may be any product or component with a display function, such as an OLED panel, an OLED television, a mobile phone, a tablet computer, a notebook computer, a display, a digital photo frame, a navigator and the like.

It will be understood that the above embodiments are merely exemplary embodiments employed to illustrate the principles of the present disclosure, and the present disclosure is not limited thereto. It will be apparent to those skilled in the art that various changes and modifications may be made without departing from the spirit and scope of the present disclosure, and these changes and modifications are to be considered within the scope of the present disclosure.

What is claimed is:

1. A display substrate, comprising:
a base;
a plurality of pixel units, each of the pixel units comprising a pixel driving circuit located on the base, each of the pixel unit further comprising a plurality of light-emitting elements located on a side, away from the base, of the pixel driving circuit and connected with the pixel driving circuit, wherein
at least two of the light-emitting elements in each of the pixel units are sequentially stacked in a direction away from the base,
each of the pixel units comprises a first light-emitting element, a second light-emitting element, and a third light-emitting element;
the first light-emitting element, the second light-emitting element and the third light-emitting element are sequentially stacked in the direction away from the base;
the first light-emitting element comprises a first electrode, a first light-emitting functional layer and a second electrode which are sequentially stacked in the direction away from the base;
the second electrode is common to an electrode of the second light-emitting element, the second light-emitting element comprises a second light-emitting functional layer and a third electrode which are sequentially stacked in a direction away from the second electrode;
the third electrode is common to an electrode of the third light-emitting element, the third light-emitting element comprises a third light-emitting functional layer and a fourth electrode sequentially stacked in a direction away from the third electrode, and wherein
the first electrode comprises a first light-emitting pattern, and the third electrode comprises a second light-emitting pattern; and
an orthographic projection of the second light-emitting pattern on the base overlaps with an orthographic projection of the first light-emitting pattern on the base.

2. The display substrate of claim 1, wherein the display substrate comprises a display area, wherein
the first light-emitting functional layer and/or the second light-emitting functional layer and/or the third light-emitting functional layer extends to cover the entire display area; and
the second electrode and/or the fourth electrode extends to cover the entire display area.

3. The display substrate of claim 2, wherein the pixel driving circuit comprises a first driving transistor and a second driving transistor,
the first driving transistor is connected with the first electrode; and
the second driving transistor is connected with the third electrode.

4. The display substrate of claim 3, wherein a first insulating layer is provided between a drain electrode of the first driving transistor and the first electrode, and the first electrode is connected to the drain electrode of the first driving transistor through a first via hole in the first insulating layer;
the first insulating layer and a pixel defining layer are provided between a drain electrode of the second driving transistor and the third electrode, and the third electrode is connected to the drain electrode of the second driving transistor through a second via hole formed in the second light-emitting functional layer, the second electrode, the first light-emitting functional layer, the pixel defining layer and the first insulating layer.

5. The display substrate of claim 4, wherein the pixel defining layer has an opening formed therein, the first light-emitting pattern is located in the opening;

an orthographic projection of the first via hole on the base is at least partially overlapped or not overlapped with the orthographic projection of the first light-emitting pattern on the base; and an orthographic projection of the second via hole on the base does not overlap with the orthographic projection of the first light-emitting pattern on the base.

6. The display substrate of claim 5, further comprising a frame area surrounding the display area, wherein the display substrate further comprises a first potential line and/or a second potential line;

the first potential line and the second potential line are located in the frame area;

the second electrode and the fourth electrode are respectively connected with the first potential line or the second potential line; or the second electrode is connected with the first potential line, and the fourth electrode is connected with the second potential line.

7. The display substrate of claim 2, wherein the first light-emitting element, the second light-emitting element and the third light-emitting element emit light with different colors; and in the plurality of pixel units, the colors of light emitted by first light-emitting elements are the same, the colors of light emitted by second light-emitting elements are the same, and the colors of light emitted by third light-emitting elements are the same; or in the plurality of pixel units, the colors of light emitted by part of first light-emitting elements are different, the colors of light emitted by part of second light-emitting elements are different, and the colors of light emitted by part of third light-emitting elements are different.

8. The display substrate of claim 2, wherein the first light-emitting element, the second light-emitting element and the third light-emitting element emit light of a same color.

9. The display substrate of claim 8, further comprising a color filter layer on a side of the light-emitting elements away from the base;

the color filter layer comprises a first color filter, a second color filter and a third color filter;

the first color filter, the second color filter and the third color filter are different in color; and the first color filter, the second color filter and the third color filter are respectively arranged corresponding to different pixel units.

10. The display substrate of claim 1, wherein the first light-emitting functional layer and/or the second light-emitting functional layer and/or the third light-emitting functional layer comprises a third pattern, an orthographic projection of the third pattern on the base covers the orthographic projection of the first light-emitting pattern on the base;

and/or the second electrode and/or the fourth electrode comprises a fourth pattern, an orthographic projection of the fourth pattern on the base covers the orthographic projection of the first liming-emitting pattern on the base.

11. The display substrate of claim 1, wherein the first electrode is made of an opaque conductive material; and the second electrode, the third electrode and the fourth electrode are made of a light-transmitting conductive material.

12. A display panel, comprising the display substrate of claim 1.

13. A display device, comprising the display panel of claim 12.

14. A method for manufacturing a display substrate, comprising:

preparing a plurality of pixel units on a base, comprising:

firstly, preparing a pixel driving circuit on the base;

then preparing a light-emitting element on a side of the pixel driving circuit away from the base, wherein at least two light-emitting elements in each pixel unit are sequentially prepared in a direction away from the base to form a stacked structure of the at least two light-emitting elements in each pixel unit, wherein each of the pixel units comprises a first light-emitting element, a second light-emitting element, and a third light-emitting element;

the first light-emitting element, the second light-emitting element and the third light-emitting element are sequentially stacked in the direction away from the base;

the first light-emitting element comprises a first electrode, a first light-emitting functional layer and a second electrode which are sequentially stacked in the direction away from the base;

the second electrode is common to an electrode of the second light-emitting element, the second light-emitting element comprises a second light-emitting functional layer and a third electrode which are sequentially stacked in a direction away from the second electrode;

the third electrode is common to an electrode of the third light-emitting element, the third light-emitting element comprises a third light-emitting functional layer and a fourth electrode sequentially stacked in a direction away from the third electrode, and wherein the first electrode comprises a first light-emitting pattern, and the third electrode comprises a second light-emitting pattern; and an orthographic projection of the second light-emitting pattern on the base overlaps with an orthographic projection of the first light-emitting pattern on the base.

15. The method of claim 14, wherein the display substrate comprises: a base; a plurality of pixel units, each of the pixel units comprising a pixel driving circuit located on the base, each of the pixel unit further comprising a plurality of light-emitting elements located on a side, away from the base, of the pixel driving circuit and connected with the pixel driving circuit, wherein at least two of the light-emitting elements in each of the pixel units are sequentially stacked in a direction away from the base, each of the pixel units comprises a first light-emitting element, a second light-emitting element, and a third light-emitting element; the first light-emitting element, the second light-emitting element and the third light-emitting element are sequentially stacked in the direction away from the base; the first light-emitting element comprises a first electrode, a first light-emitting functional layer and a second electrode which are sequentially stacked in the direction away from the base; the second electrode is common to an electrode of the second light-emitting element, the second light-emitting element comprises a second light-emitting functional layer and a third electrode which are sequentially stacked in a direction away from the second electrode; and the third electrode is common to an electrode of the third light-emitting element, the third light-emitting element comprises a third light-emitting functional layer and a fourth electrode sequentially stacked in a direction away from the third electrode, the first electrode comprises a first light-emitting pattern, and the third electrode comprises a second light-emitting pattern; and an orthographic projection of the second light-emitting pattern on the base overlaps with an orthographic projection of the first light-emitting pattern on the base, the display substrate comprises a display area, wherein the first light-emitting functional layer and/or the second light-emitting functional layer and/or the third light-emitting functional layer extends to cover the entire display area; and the second electrode and/or the fourth electrode extends to cover the entire display area, the pixel driving circuit comprises a first driving transistor and a second driving transistor, the first driving transistor is connected with the first electrode; and the second driving transistor is connected with the third electrode, a first insulating layer is provided between a drain electrode of the first driving transistor and the first electrode, and the first electrode is connected to the drain electrode of the first driving transistor through a first via hole in the first insulating layer; and the first insulating layer and a pixel defining layer are provided between a drain electrode of the second driving transistor and the third electrode, and the third electrode is connected to the drain electrode of the second driving transistor through a second via hole formed in the second light-emitting functional layer, the second electrode, the first light-emitting functional layer, the pixel defining layer and the first insulating layer, the pixel defining layer has an opening formed therein, the first light-emitting pattern is located in the opening; an orthographic projection of the first via hole on the base is at least partially overlapped or not overlapped with the orthographic projection of the first light-emitting pattern on the base; and an orthographic projection of the second via hole on the base does not overlap with the orthographic projection of the first light-emitting pattern on the base; and the display substrate further comprises a frame area surrounding the display area, wherein the display substrate further comprises a first potential line and/or a second potential line; the first potential line and the second potential line are located in the frame area; the second electrode and the fourth electrode are respectively connected with the first potential line or the second potential line; or the second electrode is connected with the first potential line, and the fourth electrode is connected with the second potential line, wherein, the method comprises:

after preparing the pixel driving circuit, a first potential line and a second potential line on the base, sequentially preparing a first insulating layer, patterns of a first via hole and a third via hole in the first insulating layer, a pattern of a first electrode, a pixel defining layer and patterns of an opening and a fourth via hole in the pixel defining layer on the base, wherein a first light-emitting pattern in the first electrode is located in the opening, and a material of the first electrode is filled in the first via hole and the third via hole;

preparing a first isolation pillar on the base subjected to the preparing above, wherein the first isolation pillar is formed in the fourth via hole;

sequentially preparing a first light-emitting functional layer, a second electrode and a second light-emitting functional layer on the base subjected to the preparing above, wherein the second electrode is overlapped with the first potential line;

soaking the base subjected to the preparing above in a peeling solution, peeling off the first isolation pillar and portions of the first light-emitting functional layer, the second electrode and the second light-emitting functional layer formed on the first isolation pillar to form a fifth via hole penetrating through the second light-emitting functional layer, the second electrode and the first light-emitting functional layer, where the fifth via hole, the fourth via hole and the third via hole are communicated to form a second via hole;

preparing a pattern of a third electrode on the base prepared above, wherein the third electrode is connected with the pixel driving circuit through the second via hole; and sequentially preparing a third light-emitting functional layer and a fourth electrode on the base prepared above, wherein the fourth electrode is overlapped with the second potential line.

16. The method of claim 15, wherein after peeling off the first isolation pillar and portions of the first light-emitting functional layer, the second electrode and the second light-emitting functional layer formed on the first isolation pillar, and before preparing the pattern of the third electrode, the method further comprises:

preparing a second isolation pillar surrounding the pattern of the third electrode;

forming a film layer for forming the third electrode on the base subjected to the preparing above; and soaking the base prepared above in a peeling solution, and peeling off the second isolation pillar and a portion of the film layer, for forming the third electrode, formed on the second isolation pillar to form the pattern of the third electrode.

17. The method of claim 15, wherein the preparing a first isolation pillar comprises:

coating a sacrificial layer on the base formed with the first insulating layer and patterns of the first via hole and the third via hole in the first insulating layer, the pattern of the first electrode, the pixel defining layer and the patterns of the opening and the fourth via hole in the pixel defining layer, and drying the sacrificial layer;

coating and forming a photoresist layer on the base prepared above, and drying the photoresist layer;

exposing the photoresist layer by using a mask plate comprising the pattern of the first isolation pillar;

developing and then removing a portion of the photoresist layer in a region except a region corresponding to the pattern of the first isolation pillar, and reserving a portion of the photoresist layer in the region corresponding to the pattern of the first isolation pillar; and developing again and then removing a portion of the sacrificial layer in the region except the region corresponding to the pattern of the first isolation pillar, and reserving a portion of the sacrificial layer in the region corresponding to the pattern of the first isolation pillar, wherein a shape of a cross-section of the first isolation pillar perpendicular to the base is an inverted trapezoid;

a dimension of the first isolation pillar at a longer upper base side of the inverted trapezoid in a direction perpendicular to the base ranges from 1 μm to 10 μm.

18. A method for driving a display substrate, wherein the display substrate, comprising: a base; a plurality of pixel units, each of the pixel units comprising a pixel driving circuit located on the base, each of the pixel unit further comprising a plurality of light-emitting elements located on a side, away from the base, of the pixel driving circuit and connected with the pixel driving circuit, at least two of the light-emitting elements in each of the pixel units are sequentially stacked in a direction away from the base, each of the pixel units comprises a first light-emitting element, a second light-emitting element, and a third light-emitting element;

the first light-emitting element, the second light-emitting element and the third light-emitting element are sequentially stacked in the direction away from the base;

the first light-emitting element comprises a first electrode, a first light-emitting functional layer and a second electrode which are sequentially stacked in the direction away from the base;

the second electrode is common to an electrode of the second light-emitting element, the second light-emitting element comprises a second light-emitting functional layer and a third electrode which are sequentially stacked in a direction away from the second electrode;

the third electrode is common to an electrode of the third light-emitting element, the third light-emitting element comprises a third light-emitting functional layer and a fourth electrode sequentially stacked in a direction away from the third electrode, the first electrode comprises a first light-emitting pattern, and the third electrode comprises a second light-emitting pattern; and an orthographic projection of the second light-emitting pattern on the base overlaps with an orthographic projection of the first light-emitting pattern on the base, and wherein the method comprises:

light-emitting elements sequentially stacked in a direction away from a base in each pixel unit are driven by a pixel driving circuit to emit light simultaneously;

or, the light-emitting elements sequentially stacked in the direction away from the base in each pixel unit are driven by the pixel driving circuit to emit light in a time-sharing manner.

* * * * *